(12) United States Patent
Fujisaki et al.

(10) Patent No.: US 12,529,364 B2
(45) Date of Patent: Jan. 20, 2026

(54) PUMP

(71) Applicant: Murata Manufacturing Co., Ltd., Kyoto (JP)

(72) Inventors: Masaaki Fujisaki, Kyoto (JP); Nobuhira Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 18/442,420

(22) Filed: Feb. 15, 2024

(65) Prior Publication Data
US 2024/0183348 A1    Jun. 6, 2024

Related U.S. Application Data

(60) Continuation of application No. 18/147,188, filed on Dec. 28, 2022, now Pat. No. 11,939,969, which is a
(Continued)

(30) Foreign Application Priority Data

May 31, 2018  (JP) ................................. 2018-104273
Jun. 25, 2018  (JP) ................................. 2018-119430
Jun. 25, 2018  (JP) ................................. 2018-119431

(51) Int. Cl.
*F16K 7/17*    (2006.01)
*F04B 43/04*   (2006.01)
(Continued)

(52) U.S. Cl.
CPC ............ *F04B 43/04* (2013.01); *F04B 43/046* (2013.01); *F04B 49/22* (2013.01); *F16K 7/17* (2013.01);
(Continued)

(58) Field of Classification Search
CPC ........ F04B 43/04; F04B 43/046; F04B 49/22; F04B 43/14; F04B 39/10; F04B 43/023;
(Continued)

(56) References Cited

U.S. PATENT DOCUMENTS 5,585,011 A    12/1996   Saaski et al.
6,033,191 A     3/2000   Kamper et al.
(Continued)

FOREIGN PATENT DOCUMENTS

CN    104121183 A   10/2014
CN    206477983 U    9/2017
(Continued)

OTHER PUBLICATIONS

International Search Report issued in Application No. PCT/JP2019/012658, dated Jul. 2, 2019.
(Continued)

*Primary Examiner* — Essama Omgba
*Assistant Examiner* — Dnyanesh G Kasture
(74) *Attorney, Agent, or Firm* — McDonald Hopkins LLC

(57) ABSTRACT

A pump includes a vibrating plate, a flow path forming member, a pump chamber, and a film valve. The vibrating plate is provided with a piezoelectric element, vibrates due to distortion of the piezoelectric element, and has a gap on an outer periphery. The flow path forming member is disposed so as to face the vibrating plate, and has a hole in a portion facing the vibrating plate. The pump chamber is surrounded by the vibrating plate and the flow path forming member, and has a central space communicating with the hole and an outer edge space communicating with the gap. The film valve is disposed in the pump chamber. The film valve is in contact with the vibrating plate and the flow path forming member when a pressure in the central space is lower than a pressure in the outer edge space.

2 Claims, 12 Drawing Sheets

Related U.S. Application Data division of application No. 17/036,011, filed on Sep. 29, 2020, now Pat. No. 11,572,872, which is a continuation of application No. PCT/JP2019/012658, filed on Mar. 26, 2019.

(51) Int. Cl.
| | | |
|---|---|---|
| *F04B 49/22* | (2006.01) | |
| *F16K 15/14* | (2006.01) | |
| *H10N 30/20* | (2023.01) | |
| *F04B 43/14* | (2006.01) | |
| *F16K 31/02* | (2006.01) | |

(52) U.S. Cl.
CPC ......... *F16K 15/14* (2013.01); *H10N 30/2047* (2023.02); *F04B 43/14* (2013.01); *F16K 31/02* (2013.01)

(58) Field of Classification Search
CPC .................. F04B 45/047; F04B 53/1047; F04B 53/1075; F04B 43/028; F16K 7/17; F16K 15/14; F16K 31/02; F16K 15/18; F16K 15/16; H01L 41/0973
USPC .................. 417/479, 545–554; 137/855
See application file for complete search history.

(56) References Cited

U.S. PATENT DOCUMENTS

| | | |
|---|---|---|
| 10,955,399 B2 | 3/2021 | Mou et al. |
| 2005/0089415 A1 | 4/2005 | Cho et al. |
| 2015/0023821 A1 | 1/2015 | Campbell et al. |
| 2018/0066650 A1 | 3/2018 | Fujisaki et al. |

FOREIGN PATENT DOCUMENTS

| | | |
|---|---|---|
| JP | 2009-074418 A | 4/2009 |
| TW | M 556 292 U | 3/2018 |
| WO | 2016/013390 A1 | 1/2016 |
| WO | 2016/175185 A1 | 11/2016 |

OTHER PUBLICATIONS

Written Opinion issued in Application No. PCT/JP2019/012658, dated Jul. 2, 2019.
Extended European Search Report for 19 81 1998.4 dated Dec. 17, 2021.
Chinese Office action for Appln. No. 201980035219.6 dated Dec. 31, 2021.

PUMP

This is a continuation application of U.S. Ser. No. 18/147,188 filed on Dec. 28, 2022, which is a divisional application of U.S. Ser. No. 17/036,011 filed on Sep. 29, 2020, which is a continuation of International Application No. PCT/JP2019/012658 filed on Mar. 26, 2019 which claims priority from Japanese Patent Application No. 2018-119431 filed on Jun. 25, 2018, Japanese Patent Application No. 2018-119430 filed on Jun. 25, 2018, and Japanese Patent Application No. 2018-104273 filed on May 31, 2018. The contents of these applications are incorporated herein by reference in their entireties.

BACKGROUND OF THE DISCLOSURE

Field of the Disclosure

The present disclosure relates to a pump using a piezoelectric body.

Description of the Related Art

Hitherto, as described in Patent Document 1, Patent Document 2, and Patent Document 3, various types of pumps for conveying fluid by using a piezoelectric body have been devised.

The pumps described in Patent Document 1, Patent Document 2, and Patent Document 3 use a vibration of the piezoelectric body to convey fluid. By using the piezoelectric body, the pumps described in Patent Document 1, Patent Document 2, and Patent Document 3 are reduced in size and height.

Further, the pumps described in Patent Document 1, Patent Document 2, and Patent Document 3 each include a rectifying mechanism that conveys fluid in one direction.

Patent Document 1: International Publication No. 2016/175185
Patent Document 2: Japanese Unexamined Patent Application Publication No. 2009-74418
Patent Document 3: International Publication No. 2016/013390

BRIEF SUMMARY OF THE DISCLOSURE

However, in the pump configurations described in Patent Document 1, Patent Document 2, and Patent Document 3, there are some restrictions on pump characteristics of each pump. The pump characteristics are represented by a pressure or a flow rate, and the higher the pressure is, the better the pump characteristics are, and the higher the flow rate is, the better the pump characteristics are.

Further, in the pump configurations described in Patent Document 1, Patent Document 2, and Patent Document 3, the pump characteristics of each pump may be limited due to the rectifying mechanism.

Therefore, an object of the present disclosure is to provide a pump having a rectifying function and having excellent pump characteristics.

A pump of the present disclosure includes a plate-shaped member, a flow path forming member, a pump chamber, and a first film valve. The plate-shaped member includes a vibrating plate with a piezoelectric element on one principal surface, a support plate, and a plurality of support members that connect the vibrating plate and the support plate and support the vibrating plate so that the vibrating plate is configured to vibrate in a principal surface direction, and includes a first vent hole between the plurality of support members. The flow path forming member is disposed so as to face the plate-shaped member, and has a second vent hole in a portion facing the plate-shaped member. The pump chamber is formed so as to be surrounded by the plate-shaped member, the flow path forming member, and a side wall member connected to the plate-shaped member and the flow path forming member, and has a central space communicating with the second vent hole and an outer edge space communicating with the first vent hole. The first film valve is disposed in the pump chamber. The first film valve is in contact with the vibrating plate and the flow path forming member when the pressure in the central space is lower than the pressure in the outer edge space.

With this configuration, in an aspect in which the second vent hole serves as a suction port and the first vent hole serves as a discharge port, a backflow of the fluid from a gap side to the pump chamber at the time of suction is suppressed.

In addition, the pump of the present disclosure preferably has the following configuration. The first film valve is disposed such that the second vent hole is located at a position within a space surrounded by an outer end of the first film valve in a plan view, and is fixed to the vibrating plate or the flow path forming member so that a portion on an outer end side can be deformed.

With this configuration, the above-described configuration for suppressing the backflow can be realized with a simple configuration.

In addition, the pump of the present disclosure preferably has the following configuration. In a plan view, a central portion of the vibrating plate has a thick portion whose thickness from the one principal surface to another principal surface is thicker than a thickness of an outer end of the vibrating plate. The first film valve has an annular shape, and an annular inner end of the first film valve is disposed along an outer edge of the thick portion.

With this configuration, the first film valve is easily and highly accurately set at a position where the above-described operation can be realized.

In addition, the pump of the present disclosure may have the following configuration. The pump includes a second film valve. The second film valve is disposed at a peripheral edge of the second vent hole and at a position closer to the second vent hole than the position where the first film valve is disposed in a plan view. The second film valve is in contact with the vibrating plate and the flow path forming member when the pressure in the central space is higher than the pressure in the outer edge space in the pump chamber.

With this configuration, when the fluid stored in the pump chamber is discharged to a gap at an outer edge, the leakage of the fluid from the second vent hole, which is the suction port, is further suppressed.

In addition, in the pump of the present disclosure, it is preferable that the second film valve be fixed to the vibrating plate or the flow path forming member so that a portion on an outer end side of the second film valve can be de formed.

With this configuration, the second film valve can be realized by a simple configuration while realizing the above-described functions.

In addition, the pump of the present disclosure may have the following configuration. The pump includes the plate-shaped member, the flow path forming member, the pump chamber, and a third film valve.

The plate-shaped member includes the vibrating plate with a piezoelectric element on one principal surface, the support plate, and the plurality of support members that connect the vibrating plate and the support plate and support the vibrating plate so that the vibrating plate is configured to vibrate in a principal surface direction, and includes the first vent hole between the plurality of support members. The flow path forming member is disposed so as to face the plate-shaped member, and has the second vent hole in a portion facing the plate-shaped member.

The pump chamber is formed so as to be surrounded by the plate-shaped member, the flow path forming member, and a side wall member connected to the plate-shaped member and the flow path forming member, and has a central space communicating with the second vent hole and an outer edge space communicating with the first vent hole. The third film valve is disposed in the pump chamber. The third film valve is in contact with the vibrating plate and the flow path forming member when the pressure in the central space is higher than the pressure in the outer edge space.

With this configuration, in an aspect in which the second vent hole serves as a discharge port and the first vent hole serves as a suction port, the leakage of fluid to the gap side at the time of discharge is suppressed.

In addition, the pump of the present disclosure preferably has the following configuration. The third film valve is disposed such that the second vent hole is located at a position within a space surrounded by an outer end of the third film valve in a plan view, and is fixed to the vibrating plate or the flow path forming member so that a portion on a center side may be deformed.

With this configuration, the above-described configuration for suppressing the leakage can be realized with a simple configuration.

In addition, the pump of the present disclosure preferably has the following configuration. In a plan view, a central portion of the vibrating plate has a thick portion whose thickness from the one principal surface to another principal surface is thicker than a thickness of an outer end of the vibrating plate. The third film valve has an annular shape, and an annular inner end of the third film valve is disposed along the outer edge of the thick portion.

With this configuration, the third film valve is easily and highly accurately set at a position where the above-described operation can be realized.

In addition, the pump of the present disclosure may have the following configuration. The pump includes a fourth film valve. The fourth film valve is disposed at a peripheral edge of the second vent hole and at a position closer to the second vent hole than the position where the third film valve is disposed in a plan view. The fourth film valve is in contact with the vibrating plate and the flow path forming member when the pressure in the central space is lower than the pressure in the outer edge space in the pump chamber.

With this configuration, when the fluid is sucked into the pump chamber from the gap at the outer edge, a backflow of the fluid from the second vent hole, which is the discharge port, is further suppressed.

In addition, the pump of the present disclosure preferably has the following configuration. The fourth film valve is fixed to the vibrating plate or the flow path forming member so that a portion on a center side can be deformed.

With this configuration, the fourth film valve can be realized by a simple configuration while realizing the above-described functions.

In addition, the pump of the present disclosure may have the following configuration. The pump includes the flat plate-shaped member, the flow path forming member, the pump chamber, a fifth film valve, a third vent hole, and a fourth vent hole. The flat plate-shaped member includes the vibrating plate with the piezoelectric element disposed on one principal surface, the support plate, and a support member that connects an outer edge of the vibrating plate and the support plate and supports the vibrating plate so that the vibrating plate is configured to vibrate in a principal surface direction. The flow path forming member is disposed so as to face the flat plate-shaped member. The pump chamber is formed so as to be surrounded by the flat plate-shaped member, the flow path forming member, and the side wall member connected to the flat plate-shaped member and the flow path forming member. The fifth film valve is fixed to the flat plate-shaped member or the flow path forming member, and is disposed in the pump chamber so as to overlap the vibrating plate in a plan view. The third vent hole is formed in the flat plate-shaped member, and the fourth vent hole is formed in the flow path forming member. The third vent hole and the fourth vent hole are disposed at positions where the fifth film valve is sandwiched therebetween in a plan view. The fifth film valve changes the flow path resistance between the third vent hole and the fourth vent hole by switching a mode in which the fifth film valve is in contact with the flow path forming member or the flat plate-shaped member and a mode in which the fifth film valve is not in contact with the flow path forming member and the flat plate-shaped member in accordance with a vibration of the vibrating plate.

With this configuration, the fifth film valve suppresses a backflow of the fluid in the pump chamber. Thus, the fluid can be conveyed from an outer edge space to a central space of the pump chamber or from the central space to the outer edge space.

In this case, in the pump of the present disclosure, it is preferable that the fifth film valve be configured to suppress the discharge of the fluid from the central space to the outer edge space of the pump chamber and to realize the influx of the fluid from the outer edge space to the central space. With this configuration, since the vibrating plate and the flow path forming member come close to each other at the time of discharge, the fifth film valve is likely to come into contact with the flow path forming member or the flat plate-shaped member, and the vibrating plate and the flow path forming member are separated from each other at the time of suction, the fifth film valve is unlikely to come into contact with the flow path forming member or the flat plate-shaped member. Therefore, it is easy to suppress the backflow at the time of discharge and it is easy to promote an inflow at the time of suction.

In addition, the pump of the present disclosure preferably has any one of the following configurations. The flow path forming member includes, in a plan view, a protruding portion that protrudes toward the vibrating plate at a position where the flow path forming member overlaps the fifth film valve. The vibrating plate includes, in a plan view, a protruding portion that protrudes toward the flow path forming member at a position where the flow path forming member overlaps the fifth film valve.

With these configurations, the switching between the mode in which the fifth film valve is in contact with the flow path forming member or the flat plate-shaped member, and the mode in which the fifth film valve is not in contact can be more quickly and reliably realized, and the backflow at the time of discharge can be further suppressed, and the inflow at the time of suction can be more easily promoted.

In addition, it is preferable that the third vent hole of the pump of the present disclosure be formed in the flat plate-shaped member.

With this configuration, it is possible to easily form a conduction path of a drive signal to the piezoelectric element.

In addition, the pump of the present disclosure preferably has the following configuration. The third vent hole is formed on an outer edge side relative to the position where the fifth film valve is disposed in the flat plate-shaped member in a plan view. The fourth vent hole is formed on the center side relative to the position overlapping the fifth film valve in the flow path forming member in a plan view.

With this configuration, since the flexibility of the support member is higher than the flexibility of the vibrating plate, it is possible to vibrate the vibrating plate largely. Therefore, with this configuration, a displacement amount at the position where the fifth film valve is disposed can be increased, and the switching between the mode in which the fifth film valve is in contact with the flow path forming member or the flat plate-shaped member and the mode in which the fifth film valve is not in contact can be more quickly and reliably realized.

In addition, in the pump of the present disclosure, it is preferable that the fourth vent hole overlap a vibration node of the vibrating plate.

With this configuration, the backflow is reliably suppressed without using a check valve.

In addition, in the pump of the present disclosure, the fourth vent hole may overlap an antinode of the center of the vibrating plate and may include the check valve that prevents the backflow from the outside to the pump chamber from occurring.

With this configuration, even when the discharge is performed from a portion overlapping the antinode of the vibration, the backflow is suppressed. Further, by utilizing the antinode of the vibration, it is possible to realize the opening and closing of the check valve more quickly and reliably.

In addition, in the pump of the present disclosure, it is preferable that the support member be formed of a material or a shape having higher flexibility than the vibrating plate.

With this configuration, even when the outer edge of the vibrating plate is supported, the vibration of the vibrating plate is promoted.

In addition, in the pump of the present disclosure, the support member preferably has a shape of a beam along the outer edge of the vibrating plate.

With this configuration, the flexibility of the support member can be made to be higher than the flexibility of the vibrating plate with a simple structure.

In addition, in the pump of the present disclosure, it is preferable that the third vent hole be formed by a gap between the support members.

With this configuration, it is possible to particularly increase the displacement amount at the position where the fifth film valve is disposed. Therefore, it is possible to realize the switching more quickly and reliably between the mode in which the fifth film valve is in contact with the flow path forming member or the flat plate-shaped member and the mode in which the fifth film valve is not in contact with the flow path forming member and the flat plate-shaped member.

In addition, the pump of the present disclosure may have the following configuration. The third vent hole is formed on the center side relative to the position overlapping the fifth film valve in the vibrating plate in a plan view. The fourth vent hole is formed at a position overlapping the support member in the flow path forming member in a plan view.

With this configuration, it is possible to realize a configuration in which the fluid is sucked from the flow path forming member side and is discharged to the vibrating plate side.

According to the present disclosure, it is possible to realize excellent pump characteristics in a pump having a rectifying function.

DETAILED DESCRIPTION OF THE DISCLOSURE

Figure 1:
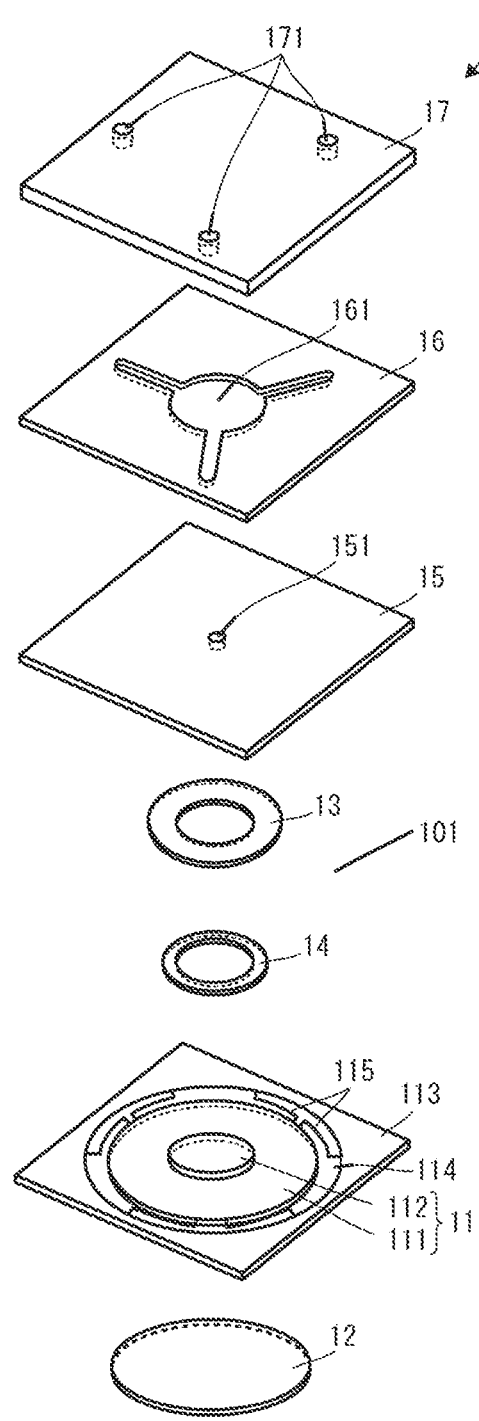
FIG. 1 is an exploded perspective view of a pump 10 according to a first embodiment of the present disclosure.
Figure 2:
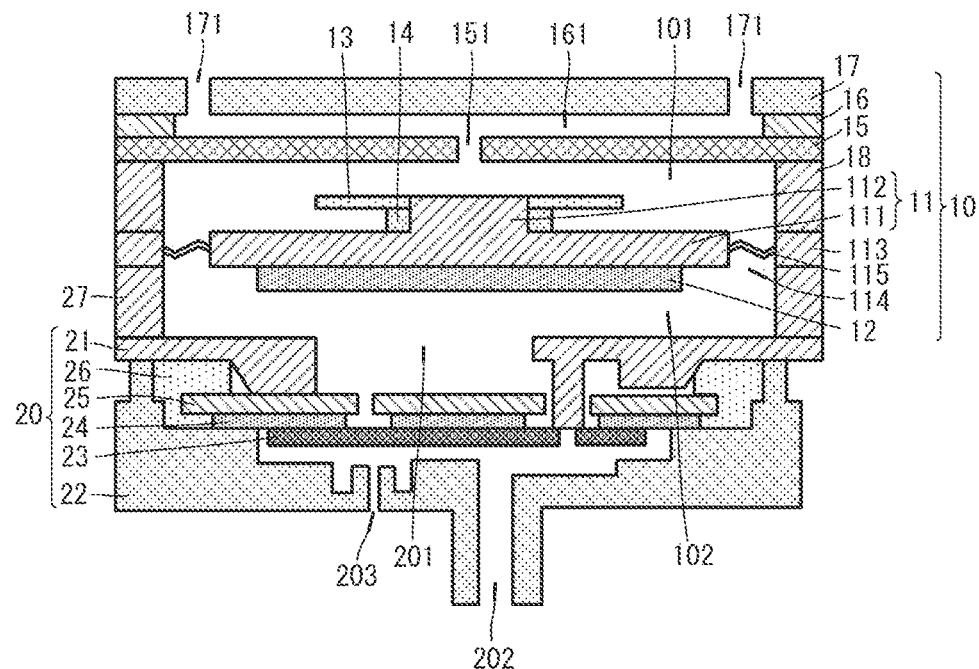
FIG. 2 is a cross-sectional view illustrating a configuration of a composite module of the pump 10 and a valve 20 according to the first embodiment of the present disclosure.

A pump according to a first embodiment of the present disclosure will be described with reference to the drawings. FIG. 1 is an exploded perspective view of a pump 10 according to the first embodiment of the present disclosure. FIG. 2 is a cross-sectional view illustrating a configuration of a composite module of the pump 10 and a valve 20 according to the first embodiment of the present disclosure. Note that, in each of the drawings illustrating each embodiment below, for easy understanding of a description, the shapes of the respective constituent elements are exaggerated in part or as a whole.

As illustrated in FIGS. 1 and 2, the pump 10 includes a vibrating plate 11, a piezoelectric element 12, a film valve 13, a joint member 14, a flow path forming member 15, a flow path forming member 16, a cover member 17, and a side wall member 18.

The vibrating plate 11 has a disk shape. The vibrating plate 11 is formed of a material and a size capable of performing a bending vibration due to the deformation (distortion) of the piezoelectric element 12. The bending vibration is a vibration with a direction orthogonal to a plate-shaped member surface as a vibration direction. Further, the vibrating plate 11 is formed of a material and a size capable of vibrating at a predetermined resonant frequency.

The vibrating plate 11 is formed of a thin portion 111 and a thick portion 112. The thick portion 112 has a shape protruding from one principal surface of the thin portion 111 and does not protrude from another principal surface. An outer shape of the thin portion 111 in a plan view and an outer shape of the thick portion 112 in a plan view are both circular. A diameter of the thick portion 112 is smaller than a diameter of the thin portion 111. The thick portion 112 is disposed in a central portion of the thin portion 111 in a plan view. The center of the thick portion 112 and the center of the thin portion 111 in a plan view substantially coincide with each other. The thick portion 112 and the thin portion 111 are integrally formed.

A support plate 113 is disposed on an outer periphery of the vibrating plate 11 so as to be separated from the vibrating plate 11. Between the vibrating plate 11 and the support plate 113, there is a gap 114. The vibrating plate 11 is connected to the support plate 113 by support members 115 formed in the gap 114. The support member 115 has a spring property. Accordingly, the vibrating plate 11 is held by the support plate 113 so as to be able to vibrate with the support members 115 interposed therebetween. A member formed of the vibrating plate 11, the support plate 113, and the support members 115 corresponds to a "plate-shaped member" of the present disclosure. In addition, the gap 114 corresponds to a "first vent hole" of the present disclosure.

The piezoelectric element 12 includes a piezoelectric body and driving electrodes. The piezoelectric body has a disk shape. The driving electrodes are formed on both principal surfaces of the piezoelectric body. The shape of the piezoelectric body is distorted by a driving voltage applied to the driving electrode. That is, the piezoelectric element 12 is distorted by the application of the driving voltage.

The piezoelectric element 12 is in contact with a surface of the vibrating plate 11 opposite to a surface on which the thick portion 112 protrudes. Accordingly, when the driving voltage is applied to the piezoelectric element 12 and the piezoelectric element 12 is distorted, the stress due to the distortion of the piezoelectric element 12 acts on the vibrating plate 11, and the vibrating plate 11 generates the above-described bending vibration.

The film valve 13 is made of a flexible material. The film valve 13 is realized by a lightweight and low rigidity material. For example, the film valve 13 is realized by a metal foil, a resin film, or the like. Note that the film valve 13 is more preferably a polyimide film. The film valve 13 corresponds to a "first film valve" of the present disclosure. For example, the film valve 13 has a thickness of 5 μm, and an outer diameter (diameter) of 5.9 mm.

The film valve 13 is disposed at a position such that a hole 151 is in a space surrounded by an outer end of the film valve 13 in a plan view.

The film valve 13 is disposed on the surface of the vibrating plate 11 on a side where the thick portion 112 protrudes. The film valve 13 has an annular shape. The film valve 13 is joined to the vibrating plate 11 by using an annular joint member 14. More specifically, a portion having a predetermined width on an inner end side of the annular shape in the film valve 13 is joined to the vibrating plate 11 by the joint member 14, and a portion on an outer end side is not joined. Accordingly, the film valve 13 is joined to the vibrating plate 11 in a state where a portion having a predetermined area on the outer end side can vibrate. For example, the joint member 14 has a thickness of 17 μm and an outer diameter (diameter) of 5.5 mm.

An inner end of the film valve 13 is located outside an outer circumference of the thick portion 112 and substantially in contact with the outer circumference. With this configuration, since the film valve 13 can be disposed with the thick portion 112 as a reference, the film valve 13 can be disposed easily and highly accurately.

A length of the film valve 13 in a radial direction excluding a portion joined to the joint member 14 is longer than an interval between the vibrating plate 11 and the flow path forming member 15. As a result, the film valve 13 is easily in contact with the flow path forming member 15. More preferably, while the vibrating plate 11 is vibrating, in a state where the vibrating plate 11 is most separated from the flow path forming member 15, by a portion having a predetermined length from the outer end toward the center of the film valve 13 taking a shape in contact with the flow path forming member 15, the film valve 13 can be easily in contact with the flow path forming member 15.

The flow path forming member 15 is a plate-shaped member. The flow path forming member 15 is made of a material having high rigidity. The flow path forming member 15 has the hole 151 at substantially the center in a plan view. The hole 151 is a through-hole that penetrates through the flow path forming member 15 in a thickness direction.

For example, a diameter of the hole 151 is about 0.8 mm. The hole 151 corresponds to a "second vent hole" of the present disclosure.

The flow path forming member 15 is disposed at a predetermined distance separated from a surface on a side in which the thick portion 112 in the vibrating plate 11 protrudes. At this time, the flow path forming member 15 is also disposed apart from the film valve 13.

The flow path forming member 16 is a plate-shaped member. The flow path forming member 16 is made of a material having high rigidity. The flow path forming member 16 has a flow path opening 161. The flow path opening 161 penetrates through the flow path forming member 16 in the thickness direction. The flow path opening 161 includes a central opening having a circular shape and a plurality of linear openings in a plan view. One ends of the plurality of linear openings in an extending direction communicate with the central opening, and the other ends reach the vicinity of the different outer ends of the flow path forming member 16, respectively.

A cover member 17 is a plate-shaped member. The cover member 17 has a plurality of holes 171. The plurality of holes 171 penetrate through the cover member 17 in the thickness direction. The plurality of holes 171 are formed near the different outer ends of the cover member 17, respectively.

The flow path forming member 15, the flow path forming member 16, and the cover member 17 are laminated in this order, and joined, respectively. Accordingly, the hole 151, the flow path opening 161, and the plurality of holes 171 communicate sequentially in this order to form a flow path on a side where the thick portion 112 of the vibrating plate 11 protrudes.

The side wall member 18 is tubular and has high rigidity. The side wall member 18 is connected to the support plate 113 and the flow path forming member 15.

With this configuration, the pump 10 has a pump chamber 101 that is a hollow space surrounded by the vibrating plate 11, the support plate 113, the flow path forming member 15, and the side wall member 18. The film valve 13 is disposed in the pump chamber 101. Further, the pump chamber 101 communicates with the hole 151 and also with the gap 114. For example, a height of the pump chamber 101 in a default state (a state in which the vibrating plate 11 is not vibrating) is about 10 μm to about 20 μm.

Then, the pump 10 utilizes a vibration of the vibrating plate 11 to change a pressure in the pump chamber 101 and convey fluid. The specific operation of the pump 10 will be described later.

In outline, the pump 10 increases a volume of the pump chamber 101 by the displacement of the vibrating plate 11 so that a pressure inside the pump chamber 101 is made to be lower than a pressure of the outside. Accordingly, the pump 10 sucks the fluid into the pump chamber 101 via the holes 171, the flow path opening 161, and the hole 151.

On the other hand, the pump 10 reduces the volume of the pump chamber 101 by the displacement of the vibrating plate 11 so that the pressure inside the pump chamber 101 is made to be higher than the pressure of the outside. Accordingly, the pump 10 discharges the fluid inside the pump chamber 101 through the gap 114.

The discharged fluid enters the valve 20. As illustrated in FIG. 2, the valve 20 includes a first case member 21, a second case member 22, a diaphragm 23, a joint film 24, a reinforcing film 25, and an adhesive member 26. In outline, the first case member 21 and the second case member 22 form a valve chamber. The first case member 21 has a suction port 201, and the suction port 201 communicates with the valve chamber. The second case member 22 has a discharge port 202 and an exhaust port 203, and the discharge port 202 and the exhaust port 203 communicate with the valve chamber.

The diaphragm 23 is joined to the reinforcing film 25 by using the joint film 24. The membranous body is disposed in the valve chamber, and divides the valve chamber into a first valve chamber communicating with the suction port 201 and a second valve chamber communicating with the discharge port 202 and the exhaust port 203. The membranous body is provided with a plurality of holes for realizing a rectifying function.

The adhesive member 26 adheres the first case member 21, the second case member 22, and the membranous body.

Such a valve 20 is connected to the pump 10 with a coupling member 27 interposed therebetween. The coupling member 27 has a tubular shape and connects the first case member 21 and the support plate 113.

In such a configuration, the fluid discharged from the gap 114 of the pump 10 flows into the valve chamber through the suction port 201 of the valve 20. By an inflow of the fluid, the membranous body formed of the diaphragm 23, the joint film 24, and the reinforcing film 25 deforms so as to be displaced toward the discharge port 202 side, and the suction port 201 and the discharge port 202 are in a communication state. Therefore, the fluid flowing from the suction port 201 is discharged to the outside through the discharge port 202. On the other hand, when the fluid flows in from the discharge port 202, the membranous body formed of the diaphragm 23, the joint film 24, and the reinforcing film 25 deforms so as to be displaced toward the suction port 201 side, and the suction port 201 and the discharge port 202 are in a non-communication state. Then, the discharge port 202 and the exhaust port 203 are in a communication state. Therefore, the fluid flowing from the discharge port 202 is discharged to the outside through the exhaust port 203.

Figure 3A:
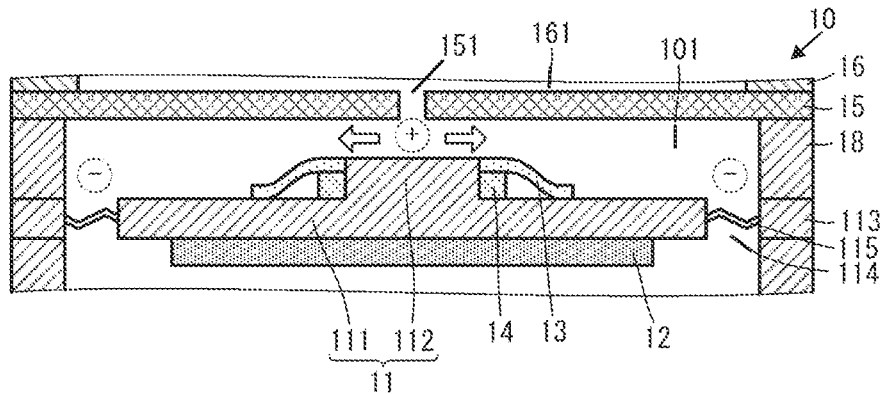
FIGS. 3A and 3B are enlarged cross-sectional views illustrating operation of a film valve 13.
Figure 3B:
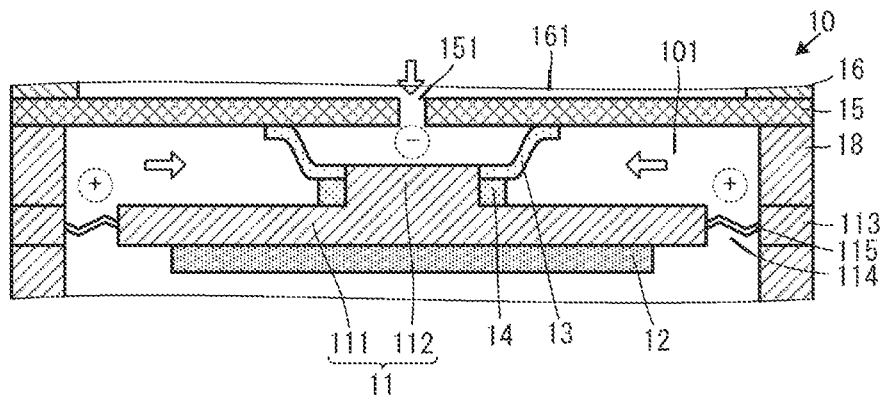

In such a configuration, the film valve 13 operates (behaves) as follows. FIGS. 3A and 3B are enlarged cross-sectional views illustrating operation of the film valve 13. Note that illustration of the displacement of the vibrating plate 11 is omitted in FIGS. 3A and 3B.

(Central Space: Relative High Pressure, Outer Edge Space: Relative Low Pressure)

When the vibrating plate 11 is displaced and the center of the vibrating plate 11 approaches the flow path forming member 15, as illustrated in FIG. 3A, a central space of the pump chamber 101 in a plan view, that is, a space closer to the center than a position where the film valve 13 is disposed has a higher pressure (relative high pressure) than an outer edge space of the pump chamber 101.

In this case, as illustrated in FIG. 3A, a portion on an outer edge side (a portion on a free end side) of the film valve 13 curves toward a vibrating plate 11 side, and is in contact with the surface of the vibrating plate 11. As a result, the central space and the outer edge space of the pump chamber 101 communicate with each other, and the fluid stored in the central space is conveyed to the outer edge space, and is discharged from the gap 114. At this time, since the film valve 13 is in contact with the surface of the vibrating plate 11, the conveyance of the fluid is not hindered and a flow rate is not reduced.

(Central Space: Relative Low Pressure, Outer Edge Space: Relative High Pressure)

When the vibrating plate 11 is displaced and the center of the vibrating plate 11 moves away from the flow path forming member 15, as illustrated in FIG. 3B, the central space of the pump chamber 101 in a plan view, that is, the space closer to the center than the position where the film valve 13 is disposed has a lower pressure (relative low pressure) than the outer edge space of the pump chamber 101.

In this case, as illustrated in FIG. 3B, the portion on the outer edge side (the portion on the free end side) of the film valve 13 curves toward a flow path forming member 15 side, and is in contact with the surface of the flow path forming member 15. As a result, the communication between the central space and the outer edge space of the pump chamber 101 is blocked. Therefore, a backflow of the fluid from the outer edge side to the central space is suppressed.

(Continuous Operation)

Figure 4:
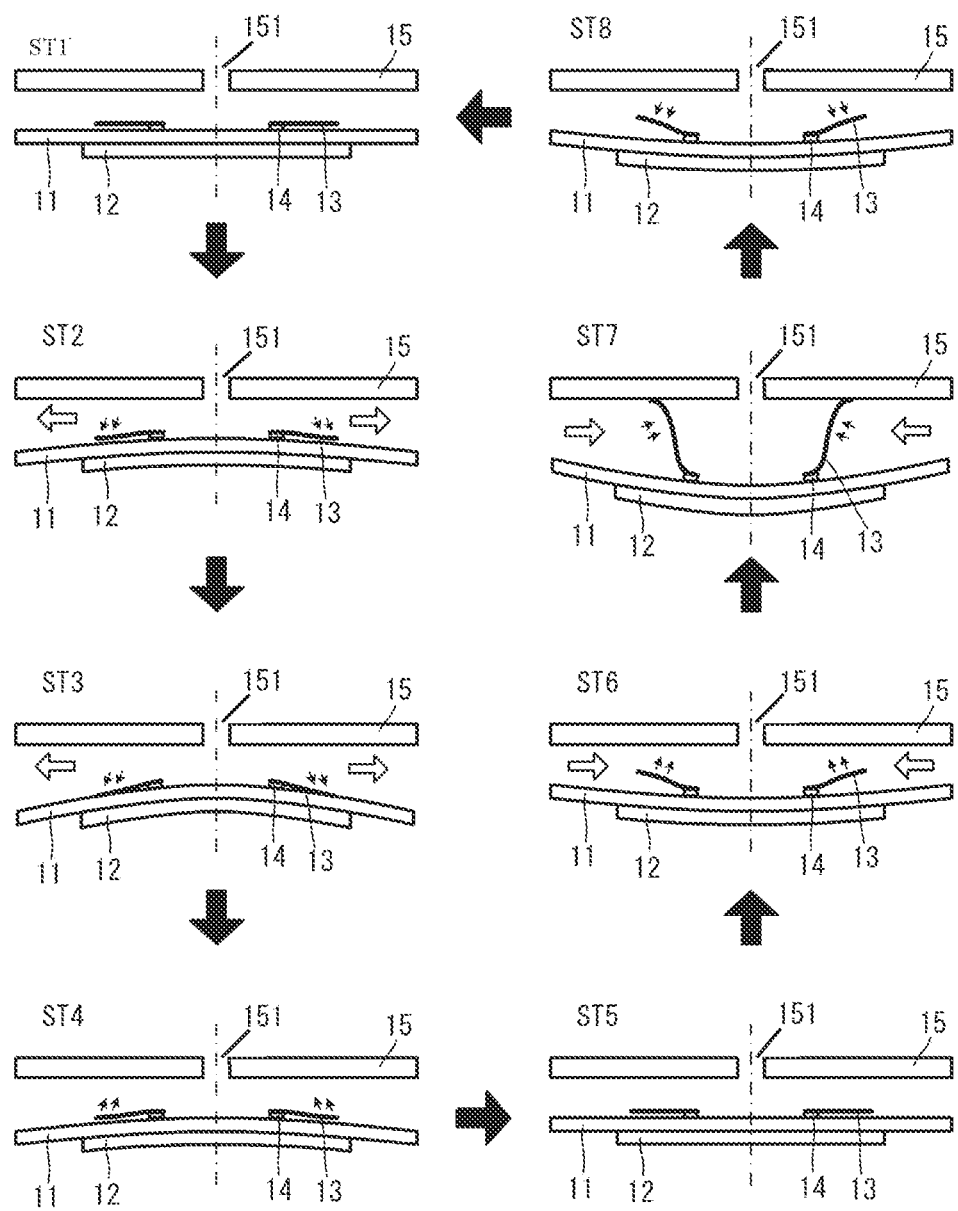
FIG. 4 is a diagram schematically illustrating operation of the pump 10.

As the vibrating plate 11 repeats a vibration, the film valve 13 repeats the operation as illustrated in FIG. 4. FIG. 4 is a diagram schematically illustrating the operation of the pump.

A state ST1 indicates a state in which the vibrating plate 11 is in a default position in the process of the pump 10 sucking the fluid and reaching the discharge. In this case, the film valve 13 is in the substantially default state, that is, a state without deformation.

In a state ST2, the central portion of the vibrating plate 11 approaches the flow path forming member 15 than in the state ST1. In this case, the pressure in the central space becomes high compared to the state ST1 and becomes high relative to the pressure in the outer edge space. As a result, the fluid is pushed out from the central space toward the outer edge. Accordingly, the portion on the outer edge side of the film valve 13 also curves toward the vibrating plate 11 side.

In a state ST3, the central portion of the vibrating plate 11 further approaches the flow path forming member 15 with respect to the state ST2. In this case, the central pressure becomes further high compared to the state ST2 and becomes further high relative to the pressure in the outer edge space. As a result, the fluid is further pushed out from the central space towards the outer edge. Accordingly, the portion on the outer edge side of the film valve 13 further curves toward the vibrating plate 11 side and is in contact with the surface of the vibrating plate 11.

In a state ST4, the central portion of the vibrating plate 11 is separated from the flow path forming member 15 with respect to the state ST3. In this case, the pressure in the central space becomes low compared to the state ST3, but becomes high relative to the pressure in the outer edge space. As a result, the portion on the outer edge side of the film valve 13 is separated from the surface of the vibrating plate 11 and approaches the default state.

A state ST5 indicates a state in which the vibrating plate 11 is in the default position after the pump 10 discharges the fluid. In this case, the film valve 13 is in the substantially default state, that is, the state without deformation.

In a state ST6, the central portion of the vibrating plate 11 is separated from the flow path forming member 15 with respect to the state ST5. In this case, the pressure in the central space becomes low compared to the state ST5 and becomes low relative to the pressure in a flow path including the hole 151 and the outer edge space. As a result, the fluid is drawn into the central space via the hole 151. Accordingly, the portion on the outer edge side of the film valve 13 curves toward the flow path forming member 15 side. The film valve 13 suppresses the backflow of the fluid from the outer edge space to the central space.

In a state ST7, the central portion of the vibrating plate 11 is separated from the flow path forming member 15 with respect to the state ST6. In this case, the central pressure becomes further low compared to the state ST6 and becomes further low relative to the pressure in the flow path including the hole 151 and the outer edge space. As a result, the fluid is further drawn into the central space via the hole 151. Accordingly, the portion on the outer edge side of the film valve 13 further curves toward the flow path forming member 15 side and is in contact with the surface of the flow path forming member 15. As a result, the outer edge space and the central space are separated by the film valve 13, and the backflow of the fluid from the outer edge space to the central space is further effectively suppressed.

In a state ST8, the central portion of the vibrating plate 11 approaches the flow path forming member 15 with respect to the state ST7. In this case, the pressure in the central space becomes high compared to the state ST7, but becomes low relative to the pressure in the outer edge space. As a result, the portion on the outer edge side of the film valve 13 is separated from the surface of the flow path forming member 15 and approaches the default state.

Then, the pump 10 returns to the state ST1 and the above-described operation is repeated.

As described above, by using the configuration of the pump 10, it is possible to suppress the backflow of the fluid through the outer edge space, that is, the gap 114, when the fluid is sucked. Further, when the fluid is conveyed from the central space to the outer edge space, that is, when the fluid is discharged from the gap 114, the film valve 13 does not hinder the conveyance of the fluid.

Figure 5:
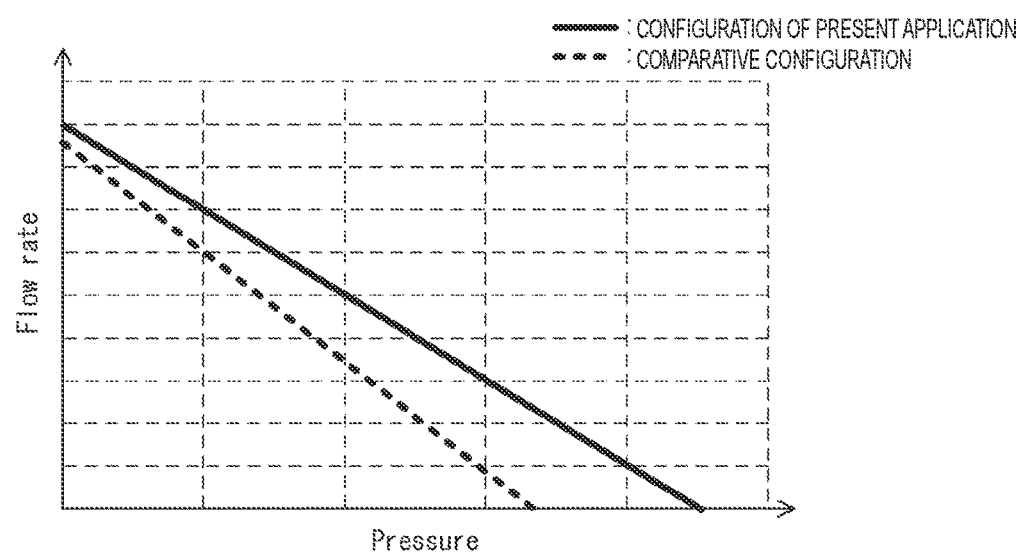
FIG. 5 is a graph showing a comparison result of P-Q characteristics.

As a result, the pump performance of the pump 10 is improved. FIG. 5 is a graph showing a comparison result of P-Q characteristics. In FIG. 5, the horizontal axis represents a pressure and the vertical axis represents a flow rate. In FIG. 5, the solid line indicates the configuration of the present application, and the broken line indicates a comparative configuration. The comparative configuration is a configuration without the film valve 13 described above.

As shown in FIG. 5, the P-Q characteristic is improved by using the configuration of the present application (pump 10). That is, the pump characteristics are improved.

Note that, in the above description, a joint position of the film valve 13 by the joint member 14 may overlap a node position of the vibration of the vibrating plate 11. As a result, it is possible to suppress a stress due to the vibration of the vibrating plate 11 being applied to the joint member 14. Therefore, it is possible to suppress the peeling off of the film valve 13.

Figure 6:
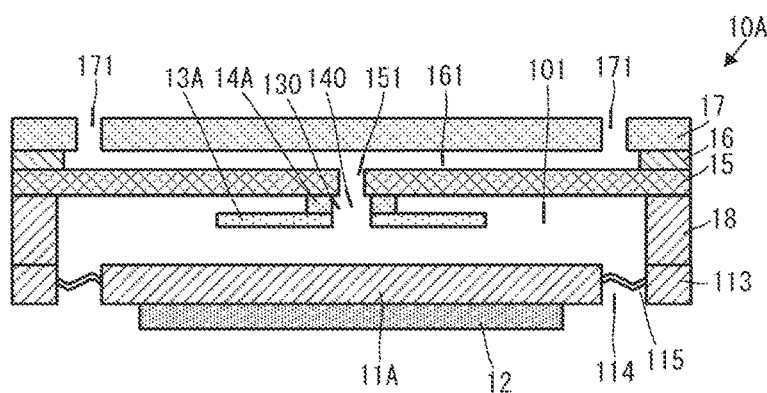
FIG. 6 is a cross-sectional view illustrating a configuration of a pump 10A according to a second embodiment of the present disclosure.

Next, a pump according to a second embodiment of the present disclosure will be described with reference to the drawings. FIG. 6 is a cross-sectional view illustrating a configuration of a pump 10A according to the second embodiment of the present disclosure.

As illustrated in FIG. 6, the pump 10A according to the second embodiment is different from the pump 10 according to the first embodiment in that a film valve 13A is set on the flow path forming member 15. Further, the pump 10A is different from the pump 10 in that a vibrating plate 11A is included. Other configuration of the pump 10A is similar to the configuration of the pump 10, and the descriptions of similar portions will be omitted.

A shape of the film valve 13A is similar to the shape of the film valve 13 illustrated in the pump 10, and a shape of a joint member 14A is similar to the shape of the joint member 14 illustrated in the pump 10.

The film valve 13A is joined to the surface of the flow path forming member 15 on the pump chamber 101 side by using the joint member 14A. At this time, the film valve 13A is disposed at a position such that the hole 151 is in a space surrounded by the outer end of the film valve 13A in a plan view.

A portion of the film valve 13A having a predetermined width on an inner end side of an annular shape is joined to the flow path forming member 15 by the joint member 14A, and a portion on an outer end side is not joined. Accordingly, the film valve 13A is joined to the flow path forming member 15 in a state where a portion having a predetermined area on the outer end side can vibrate.

The vibrating plate 11A is a flat plate having a constant thickness. Note that the vibrating plate 11A may have a shape similar to the shape of the vibrating plate 11 illustrated in the pump 10.

Figure 7A:
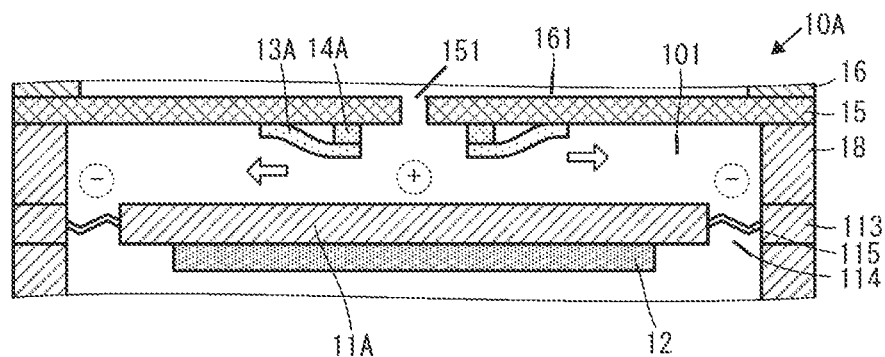
FIGS. 7A and 7B are enlarged cross-sectional views illustrating operation of a film valve 13A.
Figure 7B:
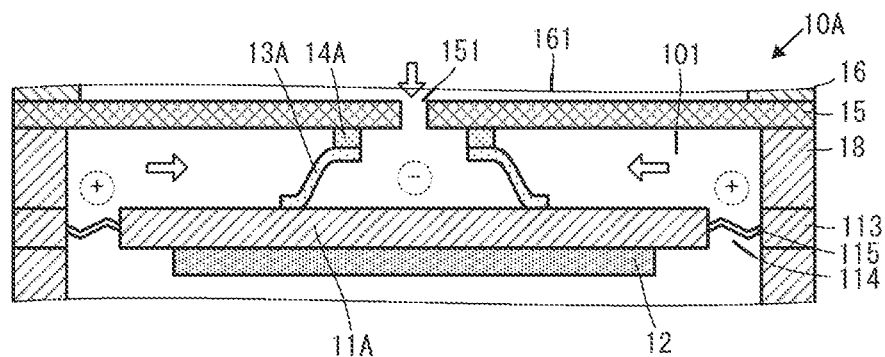

In such a configuration, the film valve 13A operates (behaves) as follows. FIGS. 7A and 7B are enlarged cross-sectional views illustrating operation of the film valve 13A. Note that illustration of the displacement of the vibrating plate 11A is omitted in FIGS. 7A and 7B.

(Central Space: Relative High Pressure, Outer Edge Space: Relative Low Pressure)

When the vibrating plate 11A is displaced and the center of the vibrating plate 11A approaches the flow path forming member 15, as illustrated in FIG. 7A, a central space of the pump chamber 101 in a plan view, that is, a space closer to the center than the position where the film valve 13A is disposed has a higher pressure (relative high pressure) than an outer edge space of the pump chamber 101.

In this case, as illustrated in FIG. 7A, the portion on an outer edge side (the portion on the free end side) of the film valve 13A curves toward a flow path forming member 15 side, and is in contact with the surface of the flow path forming member 15. As a result, the central space and the outer edge space of the pump chamber 101 communicate with each other, and the fluid stored in the central space is conveyed to the outer edge space, and is discharged from the gap 114. At this time, since the film valve 13A is in contact with the surface of the flow path forming member 15, the conveyance of the fluid is not hindered and a flow rate is not reduced.

(Central Space: Relative Low Pressure, Outer Edge Space: Relative High Pressure)

When the vibrating plate 11A is displaced and the center of the vibrating plate 11A moves away from the flow path forming member 15, as illustrated in FIG. 7B, the central space of the pump chamber 101 in a plan view, that is, the space closer to the center than the position where the film valve 13A is disposed has a lower pressure (relative low pressure) than the outer edge space of the pump chamber 101.

In this case, as illustrated in FIG. 7B, the portion on the outer edge side (the portion on the free end side) of the film valve 13A curves toward the vibrating plate 11A side, and is in contact with the surface of the vibrating plate 11A. As a result, the communication between the central space and the outer edge space of the pump chamber 101 is blocked. Therefore, a backflow of the fluid from the outer edge side to the central space is suppressed.

With such a configuration, the pump 10A can achieve similar operation and effects to the pump 10.

Further, the flow path forming member 15 does not vibrate or hardly vibrates. Therefore, it is possible to suppress a stress due to the vibration being applied to the joint member 14A, and it is possible to suppress the peeling off of the film valve 13A.

Figure 8:
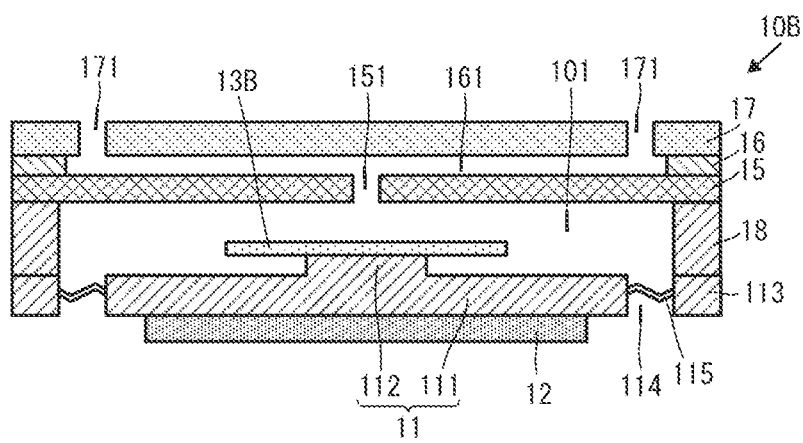
FIG. 8 is a cross-sectional view illustrating a configuration of a pump 10B according to a third embodiment of the present disclosure.

Next, a pump according to a third embodiment of the present disclosure will be described with reference to the drawing. FIG. 8 is a cross-sectional view illustrating a configuration of a pump 10B according to the third embodiment of the present disclosure.

As illustrated in FIG. 8, the pump 10B according to the third embodiment is different from the pump 10 according to the first embodiment in that a film valve 13B is provided. Other configuration of the pump 10B is similar to the configuration of the pump 10, and the descriptions of similar portions will be omitted.

The film valve 13B has a circular shape. The film valve 13B is joined to a surface of the thick portion 112 of the vibrating plate 11. At this time, a central portion of the film valve 13B having a predetermined area is joined to the thick portion 112, and a portion on an outer end side is not joined. Accordingly, the film valve 13B is joined to the vibrating plate 11 in a state where a portion having a predetermined area on the outer end side can vibrate.

With such a configuration, the pump 10B can achieve similar operation and effects to the pump 10.

Figure 9:
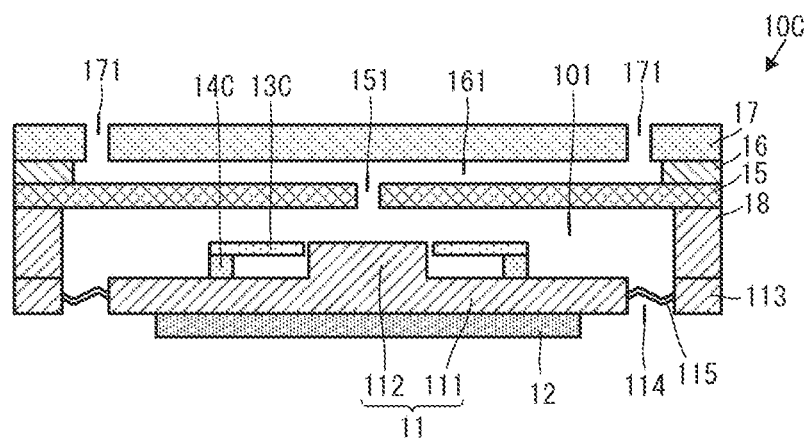
FIG. 9 is a cross-sectional view illustrating a configuration of a pump 10C according to a fourth embodiment of the present disclosure.

Next, a pump according to a fourth embodiment of the present disclosure will be described with reference to the drawings. FIG. 9 is a cross-sectional view illustrating a configuration of a pump 10C according to the fourth embodiment of the present disclosure.

As illustrated in FIG. 9, the pump 10C according to the fourth embodiment is different from the pump 10 according to the first embodiment in the fixing structure of a film valve 13C. Other configuration of the pump 10C is similar to the configuration of the pump 10, and the descriptions of similar portions will be omitted.

The film valve 13C has a configuration similar to the film valve 13. A portion of the film valve 13C having a predetermined width on an outer end side of the annular shape is joined to the vibrating plate 11 by a joint member 14C, and a portion on an inner end side is not joined. Accordingly, the film valve 13C is joined to the vibrating plate 11 in a state where a portion having a predetermined area on the inner end side can vibrate. The film valve 13C corresponds to a "third film valve" of the present disclosure.

Figure 10A:
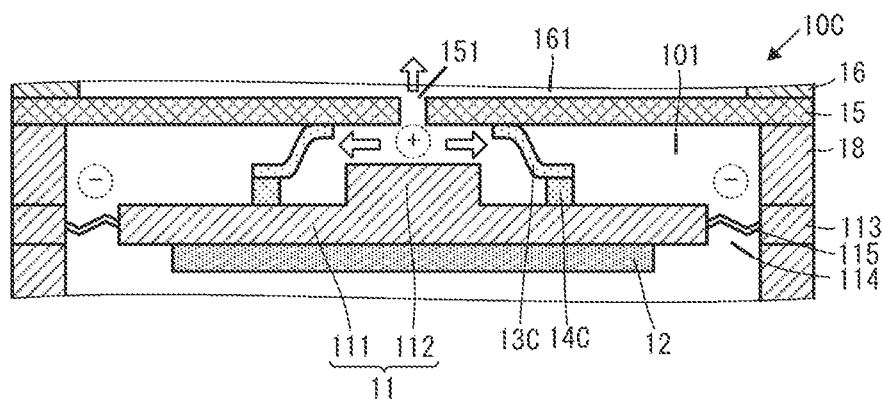
FIGS. 10A and 10B are enlarged cross-sectional views illustrating operation of a film valve 13C.
Figure 10B:
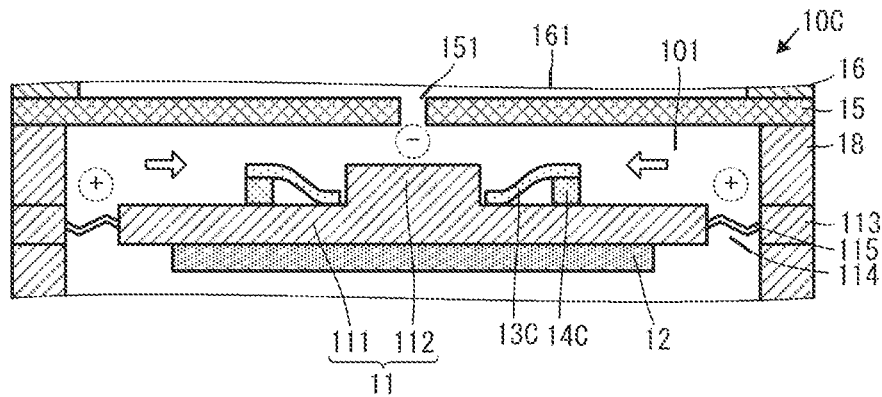

In such a configuration, the film valve 13C operates (behaves) as follows. FIGS. 10A and 10B are enlarged cross-sectional views illustrating operation of the film valve 13C. Note that illustration of the displacement of the vibrating plate 11 is omitted in FIGS. 10A and 10B.

(Central Space: Relative High Pressure, Outer Edge Space: Relative Low Pressure)

When the vibrating plate 11 is displaced and the center of the vibrating plate 11 approaches the flow path forming member 15, as illustrated in FIG. 10A, a central space of the pump chamber 101 in a plan view, that is, a space closer to the center than the position where the film valve 13C is disposed has a higher pressure (relative high pressure) than an outer edge space of the pump chamber 101.

In this case, as illustrated in FIG. 10A, the portion on the inner end side (a portion on a free end side) of the film valve 13C curves toward the flow path forming member 15, and is in contact with the surface of the flow path forming member 15. As a result, the communication between the central space and the outer edge space of the pump chamber 101 is blocked, and the fluid stored in the central space is discharged from the hole 151. That is, in the pump 10C, the hole 151 serves as a discharge port. At this time, since the film valve 13C is in contact with the surface of the flow path forming member 15, the leakage of the fluid from the central space toward the outer end side is suppressed.

(Central Space: Relative Low Pressure, Outer Edge Space: Relative High Pressure)

When the vibrating plate 11 is displaced and the center of the vibrating plate 11 moves away from the flow path forming member 15, as illustrated in FIG. 10B, the central space of the pump chamber 101 in a plan view, that is, a space closer to the center than the position where the film valve 13C is disposed has a lower pressure (relative low pressure) than the outer edge space of the pump chamber 101.

In this case, as illustrated in FIG. 10B, the portion on the inner end side (the portion on the free end side) of the film valve 13C curves toward the vibrating plate 11 side and is in contact with the surface of the vibrating plate 11. As a result, the central space and the outer edge space of the pump chamber 101 communicate with each other. Therefore, the fluid is sucked from the gap 114 into the central space through the outer edge space. At this time, since the film valve 13C is in contact with the surface of the vibrating plate 11, the conveyance of the fluid is not hindered and a flow rate is not reduced.

As described above, the pump 10C has a configuration in which a suction port and a discharge port are disposed in reverse with respect to the pump 10.

Then, by using the configuration of the pump 10C, it is possible to suppress the leakage of the fluid through the outer edge space, that is, the gap 114, when the fluid is discharged. Further, when the fluid is conveyed from the outer edge space to the central space, that is, when the fluid is sucked from the gap 114, the film valve 13C does not hinder the conveyance of the fluid. As a result, the pump performance of pump 10C is improved.

Figure 11:
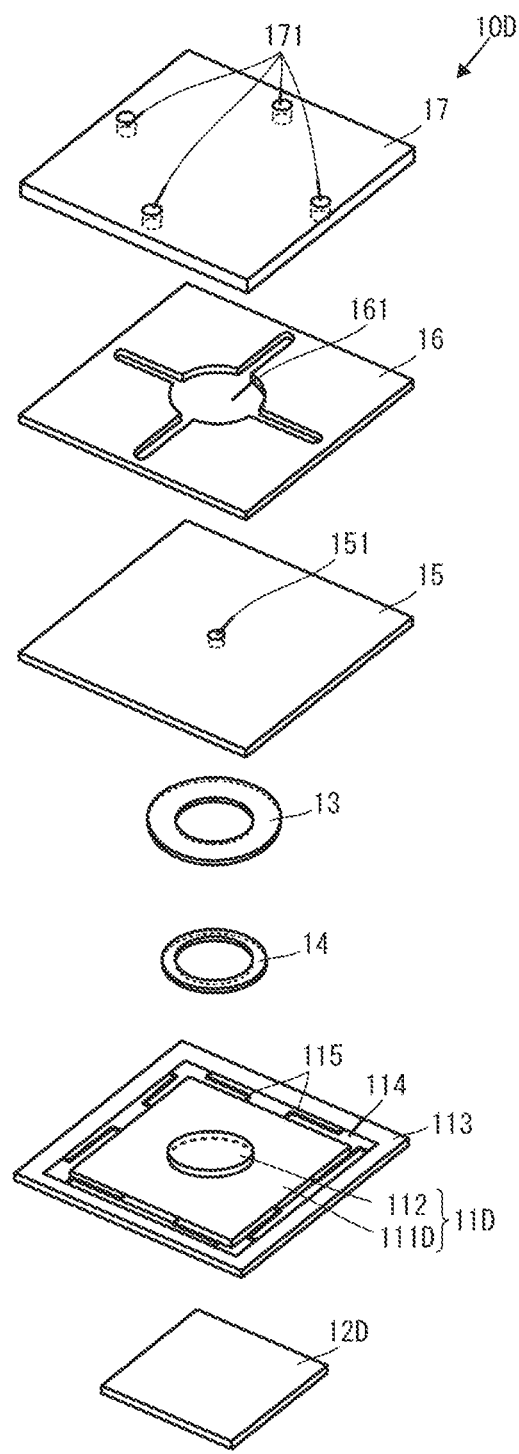
FIG. 11 is an exploded perspective view of a pump 10D according to a fifth embodiment of the present disclosure.

Next, a pump according to a fifth embodiment of the present disclosure will be described with reference to the drawing. FIG. 11 is an exploded perspective view of a pump 10D according to the fifth embodiment of the present disclosure.

As illustrated in FIG. 11, the pump 10D according to the fifth embodiment is different from the pump 10 according to the first embodiment in a shape of a vibrating plate 11D and a shape of a piezoelectric element 12D. Other configuration of the pump 10D is similar to the configuration of the pump 10, and the descriptions of similar portions will be omitted.

As illustrated in FIG. 11, the vibrating plate 11D has a thin rectangular portion 111D. Further, the piezoelectric element 12D has a rectangular shape.

Even with such a configuration, the pump 10D can obtain similar operation and effects to the pump 10.

Figure 12:
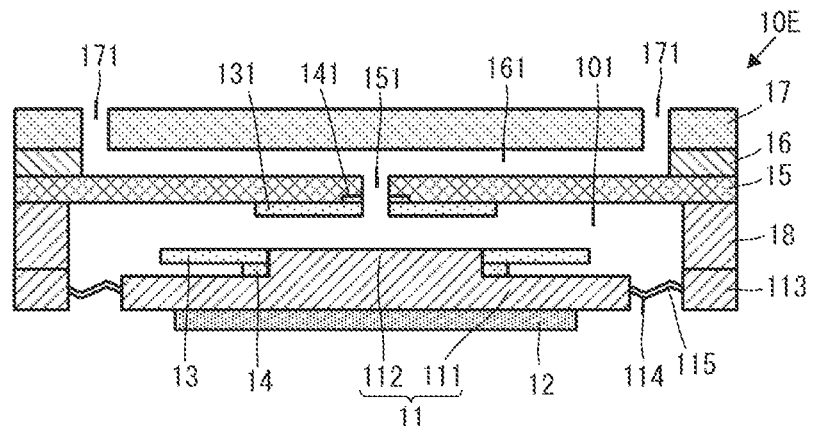
FIG. 12 is a cross-sectional view illustrating a configuration of a pump 10E according to a sixth embodiment of the present disclosure.

Next, a pump according to a sixth embodiment of the present disclosure will be described with reference to the drawings. FIG. 12 is a cross-sectional view illustrating a configuration of a pump 10E according to the sixth embodiment of the present disclosure.

As illustrated in FIG. 12, the pump 10E according to the sixth embodiment is different from the pump 10 according to the first embodiment in that a film valve 131 and a joint member 141 are added. Other configuration of the pump 10E is similar to the configuration of the pump 10, and the descriptions of similar portions will be omitted.

The pump 10E includes the film valve 131 and the joint member 141.

The film valve 131 is disposed on a center side relative to the film valve 13 in a plan view. The film valve 131 is circular and has a through-hole in the center.

The film valve 131 is joined to the flow path forming member 15 with the joint member 141 interposed therebetween in a state where the through-hole overlaps the hole 151. At this time, a portion of the film valve 131 having a predetermined width on an inner end side that is in contact with the through-hole is joined to the flow path forming member 15 by the joint member 141, and a portion on an outer end side is not joined. Accordingly, the film valve 131 is joined to the flow path forming member 15 in a state where a portion having a predetermined area on the outer end side can vibrate. The film valve 131 corresponds to a "second film valve" of the present disclosure.

As described above, in the pump 10E, the film valve 13 and the film valve 131 have the same positional relationship between a fixed end portion (an end portion fixed by the joint member) and a free end (an end portion not fixed by the joint member) in a direction connecting the center and an outer edge.

Figure 13A:
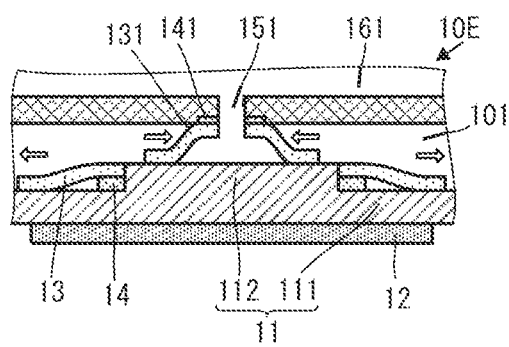
FIGS. 13A and 13B are enlarged cross-sectional views illustrating the operation of film valves 13 and 131.
Figure 13B:
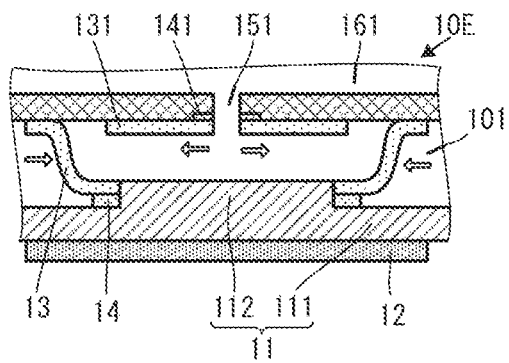

In such a configuration, the film valve 13 operates (behaves) as follows. FIGS. 13A and 13B are enlarged cross-sectional views illustrating operation of the film valves. Note that illustration of the displacement of the vibrating plate 11 is omitted in FIGS. 13A and 13B.

(Central Space: Relative High Pressure, Outer Edge Space: Relative Low Pressure)

When the vibrating plate 11 is displaced and the center of the vibrating plate 11 approaches the flow path forming member 15, as illustrated in FIG. 13A, a central space of the pump chamber 101 in a plan view, that is, a space closer to the center than a position where the film valve 13 is disposed has a higher pressure (relative high pressure) than an outer edge space of the pump chamber 101.

In this case, as illustrated in FIG. 13A, a portion on an outer edge side (a portion on a free end side) of the film valve 13 curves toward the vibrating plate 11 side, and is in contact with the surface of the vibrating plate 11. As a result, the central space and the outer edge space of the pump chamber 101 communicate with each other, and the fluid stored in the central space is conveyed to the outer edge space, and is discharged from the gap 114. At this time, since the film valve 13 is in contact with the surface of the vibrating plate 11, the conveyance of the fluid is not hindered and a flow rate is not reduced.

Further, as illustrated in FIG. 13A, a portion on an outer edge side (the portion on the free end side) of the film valve 131 curves toward the vibrating plate 11 side, and is in contact with the surface of the vibrating plate 11. As a result, the communication between the central space and the hole 151 of the pump chamber 101 is blocked, and the leakage of the fluid stored in the central space from the hole 151 is suppressed. This allows the fluid to be discharged more efficiently.

(Central Space: Relative Low Pressure, Outer Edge Space: Relative High Pressure)

When the vibrating plate 11 is displaced and the center of the vibrating plate 11 moves away from the flow path forming member 15, as illustrated in FIG. 13B, the central space of the pump chamber 101 in a plan view, that is, the space closer to the center than a position where the film valve 13 is disposed has a lower pressure (relative low pressure) than the outer edge space of the pump chamber 101.

In this case, as illustrated in FIG. 13B, the portion on the outer edge side (the portion on the free end side) of the film valve 13 curves toward the flow path forming member 15 side, and is in contact with the surface of the flow path forming member 15. As a result, the communication between the central space and the outer edge space of the pump chamber 101 is blocked. Therefore, a backflow of the fluid from the outer edge side to the central space is suppressed.

Further, as illustrated in FIG. 13B, the portion on the outer edge side (the portion on the free end side) of the film valve 131 curves toward the flow path forming member 15 side, and is in contact with the surface of the flow path forming member 15. As a result, the central space of the pump chamber 101 and the hole 151 communicate with each other, and the fluid is sucked into the central space from the hole 151. As described above, the film valve 131 does not hinder the suction of the fluid from the hole 151.

Figure 14:
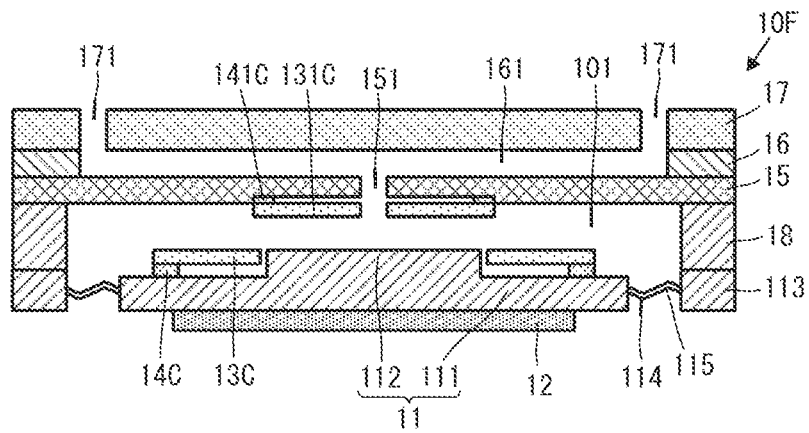
FIG. 14 is a cross-sectional view illustrating a configuration of a pump 10F according to a seventh embodiment of the present disclosure.

Next, a pump according to a seventh embodiment of the present disclosure will be described with reference to the drawings. FIG. 14 is a cross-sectional view illustrating a configuration of a pump 10F according to the seventh embodiment of the present disclosure.

As illustrated in FIG. 14, the pump 10F according to the seventh embodiment is different from the pump 10C according to the fourth embodiment in that a film valve 131C and a joint member 141C are added. Other configuration of the pump 10F is similar to the configuration of the pump 10C, and the descriptions of similar portions will be omitted.

The pump 10F includes the film valve 131C and the joint member 141C.

The film valve 131C is disposed on a center side relative to the film valve 13C in a plan view. The film valve 131C is circular and has a through-hole in the center.

The film valve 131C is joined to the flow path forming member 15 with the joint member 141C interposed therebetween in a state where the through-hole overlaps the hole 151. At this time, a portion of the film valve 131C having a predetermined width on an outer end side is joined to the flow path forming member 15 by the joint member 141C, and a portion on an inner end side is not joined. Accordingly, the film valve 131C is joined to the flow path forming member 15 in a state where a portion having a predetermined area on the inner end side can vibrate. The film valve 131C corresponds to a "fourth film valve" of the present disclosure.

As described above, in the pump 10F, the film valve 13C and the film valve 131C have the same positional relationship between a fixed end portion (an end portion fixed by the joint member) and a free end (an end portion not fixed by the joint member) in a direction connecting the center and an outer edge.

Figure 15A:
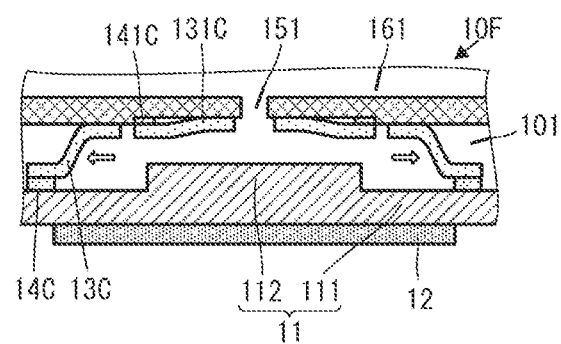
FIGS. 15A and 15B are enlarged cross-sectional views illustrating the operation of film valves 13C and 131C.
Figure 15B:
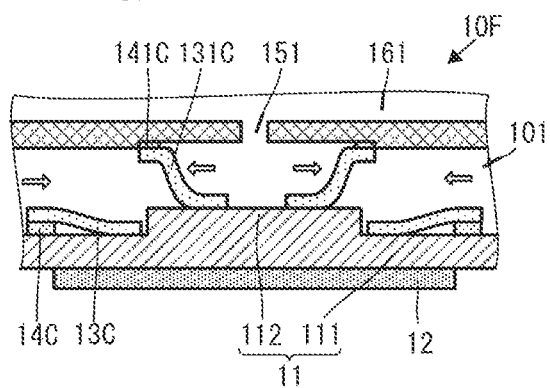

In such a configuration, the film valve 13C operates (behaves) as follows. FIGS. 15A and 15B are enlarged cross-sectional views illustrating operation of the film valves. Note that illustration of the displacement of the vibrating plate 11 is omitted in FIGS. 15A and 15B.

(Central Space: Relative High Pressure, Outer Edge Space: Relative Low Pressure)

When the vibrating plate 11 is displaced and the center of the vibrating plate 11 approaches the flow path forming member 15, as illustrated in FIG. 15A, a central space of the pump chamber 101 in a plan view, that is, a space closer to the center than a position where the film valve 13C is disposed has a higher pressure (relative high pressure) than an outer edge space of the pump chamber 101.

In this case, as illustrated in FIG. 15A, a portion on an inner end side (a portion on a free end side) of the film valve 13C curves toward the flow path forming member 15, and is in contact with the surface of the flow path forming member 15. As a result, the communication between the central space and the outer edge space of the pump chamber 101 is blocked, and the fluid stored in the central space is discharged from the hole 151. That is, in the pump 10E, the hole 151 serves as a discharge port. At this time, since the film valve 13C is in contact with the surface of the flow path forming member 15, the leakage of the fluid from the central space toward the outer end side is suppressed.

Further, as illustrated in FIG. 15A, a portion on an inner end side (the portion on the free end side) of the film valve 131C curves toward a flow path forming member 15 side, and is in contact with the surface of the flow path forming member 15. As a result, the central space of the pump chamber 101 and the hole 151 communicate with each other, and the fluid stored in the central space is discharged from the hole 151. At this time, since the film valve 131C is in contact with the surface of the flow path forming member 15, the discharge of the fluid is not hindered and a flow rate is not reduced.

(Central Space: Relative Low Pressure, Outer Edge Space: Relative High Pressure)

When the vibrating plate 11 is displaced and the center of the vibrating plate 11 moves away from the flow path forming member 15, as illustrated in FIG. 15B, the central space of the pump chamber 101 in a plan view, that is, the space closer to the center than the position where the film valve 13C is disposed has a lower pressure (relative low pressure) than the outer edge space of the pump chamber 101.

In this case, as illustrated in FIG. 15B, the portion on the inner end side (the portion on the free end side) of the film valve 13C curves toward the vibrating plate 11 side and is in contact with the surface of the vibrating plate 11. As a result, the central space and the outer edge space of the pump chamber 101 communicate with each other. Therefore, the fluid is sucked from the gap 114 into the central space through the outer edge space. At this time, since the film valve 13C is in contact with the surface of the vibrating plate 11, the conveyance of the fluid is not hindered and the flow rate is not reduced.

Further, as illustrated in FIG. 15B, the portion on the inner end side (the portion on the free end side) of the film valve 131C curves toward the vibrating plate 11 side, and is in contact with the surface of the vibrating plate 11. As a result, the communication between the central space and the hole 151 of the pump chamber 101 is blocked, and a backflow of the fluid from the hole 151 to the central space is suppressed.

Figure 16:
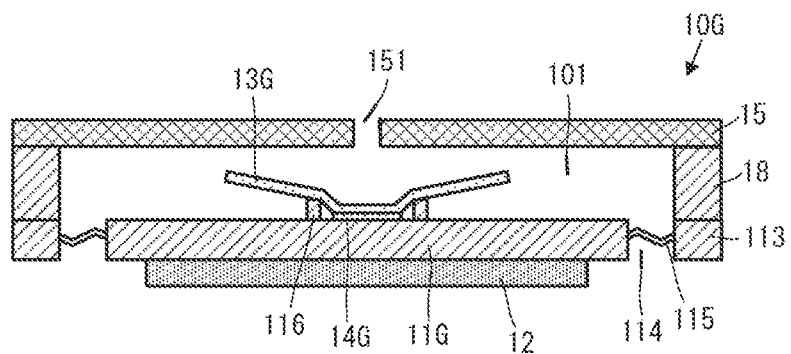
FIG. 16 is a cross-sectional view illustrating a configuration of a pump 10G according to an eighth embodiment of the present disclosure.

Next, a pump according to an eighth embodiment of the present disclosure will be described with reference to the drawing. FIG. 16 is a cross-sectional view illustrating a configuration of a pump 10G according to the eighth embodiment of the present disclosure. Note that, in FIG. 16, only the minimum necessary configuration is described as a pump, and the descriptions of the other parts are omitted.

As illustrated in FIG. 16, the pump 10G according to the eighth embodiment is different from the pump 10 according to the first embodiment in a vibrating plate 11G, a film valve 13G, and a joint member 14G. Other configuration of the pump 10G is similar to the configuration of the pump 10, and the descriptions of similar portions will be omitted.

As illustrated in FIG. 16, the pump 10G has a wall 116 on one principal surface in the vibrating plate 11G. The wall 116 has a shape protruding from the one principal surface of the vibrating plate 11G toward the flow path forming member 15 side (pump chamber 101 side), and has an annular shape in a plan view.

In a plan view of the pump 10G, an inner space surrounded by the wall 116 overlaps the hole 151 of the flow path forming member 15.

The film valve 13G has a circular shape in a plan view. A central portion of the film valve 13G is located in a central cavity formed by the wall 116. Then, the central portion of the film valve 13G is joined to the one principal surface of the vibrating plate 11G by the joint member 14G.

With this configuration, the film valve 13G is fixed to the vibrating plate 11G so that a portion on the outer end side can be deformed. Therefore, the pump 10G can achieve similar operation and effects to the pump 10 according to the first embodiment.

Figure 17:
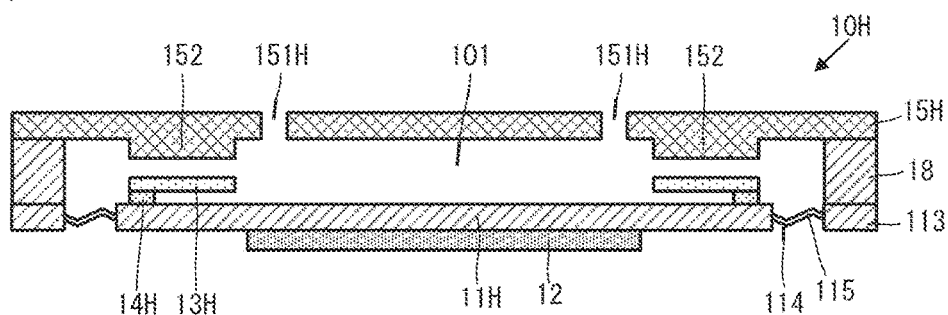
FIG. 17 is a cross-sectional view illustrating a configuration of a pump 10H according to a ninth embodiment of the present disclosure.

Next, a pump according to a ninth embodiment of the present disclosure will be described with reference to the drawings. FIG. 17 is a cross-sectional view illustrating a configuration of a pump 10H according to the ninth embodiment of the present disclosure. Note that, in FIG. 17, only the minimum necessary configuration is described as a pump, and the descriptions of the other parts are omitted.

As illustrated in FIG. 17, the pump 10H according to the ninth embodiment is different from the pump 10C according to the fourth embodiment in an arrangement aspect of a film valve 13H with respect to a vibrating plate 11H and a shape of a flow path forming member 15H. Other configuration of the pump 10H is similar to the configuration of the pump 10E, and the descriptions of similar portions will be omitted.

The pump 10H includes the vibrating plate 11H, the piezoelectric element 12, the film valve 13H, a joint member 14H, the flow path forming member 15H, and the side wall member 18.

Figure 18:
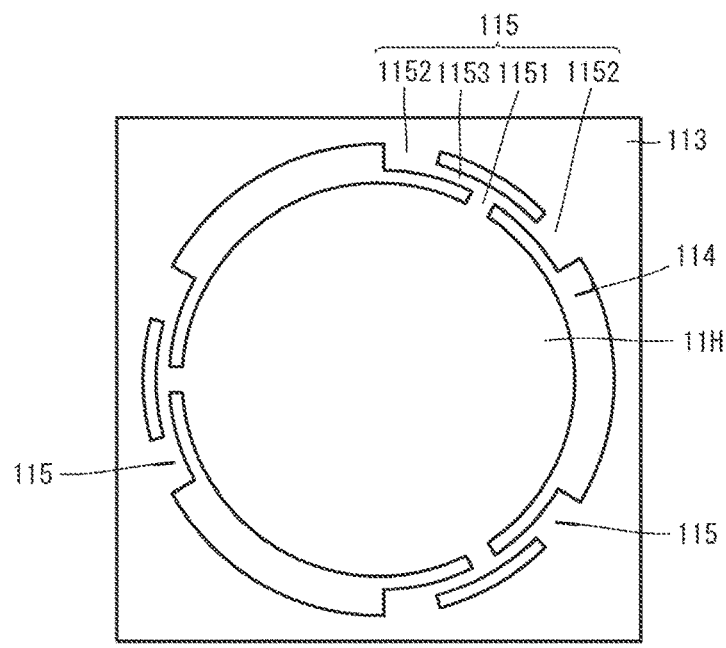
FIG. 18 is a plan view of a vibrating plate 11H of the pump 10H according to the ninth embodiment of the present disclosure.

FIG. 18 is a plan view of the vibrating plate 11H of the pump 10H according to the ninth embodiment of the present disclosure. As illustrated in FIG. 18, the vibrating plate 11H has a disk shape in a plan view. The vibrating plate 11H has a constant thickness. The support plate 113 is disposed on an outer periphery of the vibrating plate 11H so as to be separated from the vibrating plate 11H. The support plate 113 has, for example, a rectangular shape in a plan view. The vibrating plate 11H and the support plate 113 are connected by the plurality of support members 115. The support member 115 includes a first beam portion 1151, second beam portions 1152, and a third beam portion 1153. The first beam portion 1151 is connected to an outer edge of the vibrating plate 11H and is not connected to the support plate 113. The second beam portion 1152 is connected to the support plate 113 and is not connected to the outer edge of the vibrating plate 11H. The two second beam portions 1152 are disposed in a direction along the outer edge of the vibrating plate 11H with the first beam portion 1151 interposed therebetween. The third beam portion 1153 has a shape extending in the direction along the outer edge of the vibrating plate 11H, and connects the first beam portion 1151 and the two second beam portions 1152. Thus, the support member 115 is a beam that supports the vibrating plate 11H for the support plate 113. The three support members 115 are formed, and the three support members 115 are spaced apart from one another in the direction along the outer edge of the vibrating plate 11H. For example, in an example of FIG. 18, the three support members 115 are disposed so as to form an angle of 120° with the center of the vibrating plate 11H as a reference point.

Then, a portion where the support members 115 are not formed between the vibrating plate 11H and the support plate 113 is the gap 114.

As an example, the dimensions of each member are as follows. The circular vibrating plate 11H has a thickness of 0.6 mm and a diameter φ of 15 mm. The circular piezoelectric element 12 has a thickness of 0.15 mm and a diameter of 10.6 mm. A boundary portion between a portion where the vibrating plate 11H and the film valve 13H are joined and a deformable portion is located at a position of 7.0 mm from the center of the pump chamber 101. The vibrating plate 11H vibrates at a frequency of 26.8 kHz. Alternatively, when the thickness of the vibrating plate 11H is 0.7 mm and the other dimensions are not changed, the vibrating plate vibrates at a frequency of 30.6 kHz.

With such a configuration, the support member 115 has higher flexibility than the vibrating plate 11H. Therefore, the force with which the support member 115 restrains the vibrating plate 11H is weak. Accordingly, the vibrating plate 11H can vibrate with large displacement. With this configuration, the vibrating plate 11H has an antinode at the center, has a node at an intermediate position from the center to the outer edge, and has an antinode at the outer edge or in the vicinity thereof, which enables the resonance vibration represented by the Bessel function of the first kind. Here, a portion formed of the vibrating plate 11H, the support plate 113, and the support member 115 corresponds to a "flat plate-shaped member" of the present disclosure, and the gap 114 corresponds to a "third vent hole" of the present disclosure.

The piezoelectric element 12 is disposed on one principal surface of the vibrating plate 11H.

The film valve 13H is made of a flexible material. The film valve 13H has an annular shape. The film valve 13H is disposed in the vicinity of the outer edge of the vibrating plate 11H. Note that the film valve 13H may be disposed on an outer edge side relative to the vibration node of the vibrating plate 11H, and is preferably close to the antinode at the outer edge. This film valve 13H corresponds to a "fifth film valve" of the present disclosure.

The film valve 13H is joined to the vibrating plate 11H by the annular-shaped joint member 14H. At this time, the film valve 13H is joined so that a central portion can be deformed.

The flow path forming member 15H is a plate-shaped member. The flow path forming member 15H has an annular-shaped protruding portion 152. In a plan view, at least a part of the annular-shaped protruding portion 152 overlaps the film valve 13H. The center of the protruding portion 152 and the center of the film valve 13H substantially coincide with each other.

The flow path forming member 15H is disposed such that a surface formed by the protruding portion 152 faces the vibrating plate 11H.

The flow path forming member 15H has a plurality of holes 151H. The plurality of holes 151H penetrate through the flow path forming member 15H in a thickness direction. The plurality of holes 151H are disposed so as to be spaced apart from each other in the circumferential direction.

Preferably, the plurality of holes 151H overlap the node of the vibration of the vibrating plate 11H. The plurality of holes 151H correspond to a "fourth vent hole" of the present disclosure.

The side wall member 18 is tubular and has high rigidity. The side wall member 18 is connected to the support plate 113 and the flow path forming member 15H.

With this configuration, the pump 10H has the pump chamber 101 that is a hollow space surrounded by the vibrating plate 11H, the support plate 113, the flow path forming member 15H, and the side wall member 18. The film valve 13H is disposed in the pump chamber 101. Further, the pump chamber 101 communicates with the holes 151H and also with the gap 114.

Figure 19A:
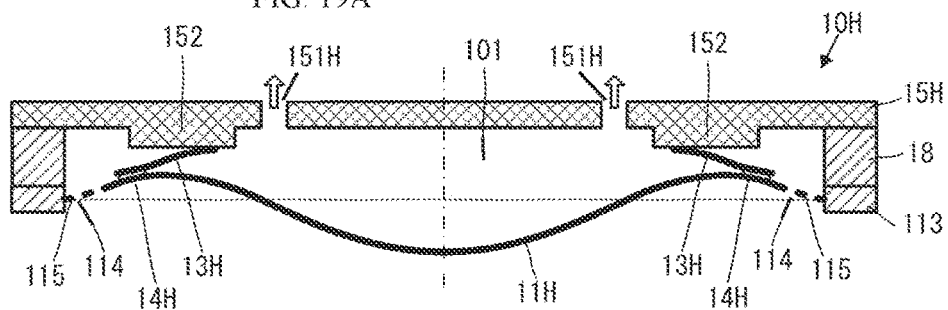
FIG. 19A is a side cross-sectional view illustrating a state of the pump 10H when fluid is discharged.
Figure 19B:
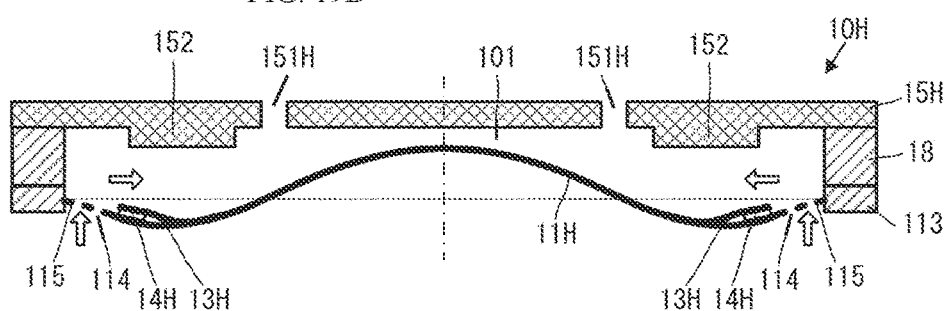
FIG. 19B is a side cross-sectional view illustrating a state of the pump 10H when the fluid is sucked.

The pump 10H having such a configuration behaves as illustrated in FIGS. 19A and 19B to repeat suction and discharge of fluid. FIG. 19A is a side cross-sectional view illustrating a state of the pump 10H when fluid is discharged, and FIG. 19B is a side cross-sectional view illustrating a state of the pump 10H when the fluid is sucked.

As described above, when the vibrating plate 11H generates the vibration represented by the Bessel function of the first kind, the change in volume of the pump chamber 101 due to the vibration of the vibrating plate 11H becomes larger in an outer edge space than in a central space. That is, the change in volume outside the vibration node becomes larger than the change in volume inside the vibration node.

Therefore, as illustrated in FIG. 19A, when the antinode at the center of the vibrating plate 11H moves away from the flow path forming member 15H and the antinode on the outer edge side approaches the flow path forming member 15H, the pump chamber 101 decreases in volume and its pressure becomes a positive pressure. Therefore, the fluid in the pump chamber 101 is discharged from the holes 151H. At this time, the film valve 13H disposed in the vicinity of the antinode on the outer edge side is in contact with the surface of the protruding portion 152 of the flow path forming member 15H. Therefore, it is possible to suppress a backflow of the fluid in the pump chamber 101 to the gap 114 on the outer edge side.

On the other hand, as illustrated in FIG. 19B, when the antinode at the center of the vibrating plate 11H approaches the flow path forming member 15H and the antinode on the outer edge side moves away from the flow path forming member 15H, the pump chamber 101 expands in volume and its pressure becomes a negative pressure. Thus, the fluid flows into the pump chamber 101 from the gap 114. At this time, a distance between the flow path forming member 15H and the vibrating plate 11H increases, so that a flow path becomes large and the film valve 13H largely separates from the flow path forming member 15H. Accordingly, it is possible to suppress a decrease in flow rate of the fluid flowing from the gap 114.

Further, in the pump 10H, the plurality of holes 151H overlap the node of the vibration of the vibrating plate 11H (pressure fluctuation). For this reason, the pressure difference between the inside and the outside of the pump chamber 101 is not large. Therefore, the flow rate of the fluid flowing into the pump chamber 101 from the gap 114 and the flow rate of the fluid discharged from the holes 151H become substantially equal, and a backflow through the holes 151H can be suppressed without using a check valve.

In addition, in the pump 10H, since the protruding portion 152 and the film valve 13H overlap each other in a plan view, a distance between the film valve 13H and the protruding portion 152 when not operating can be shortened, and the sealing of the flow path by the film valve 13H can be quickly performed.

Figure 20:
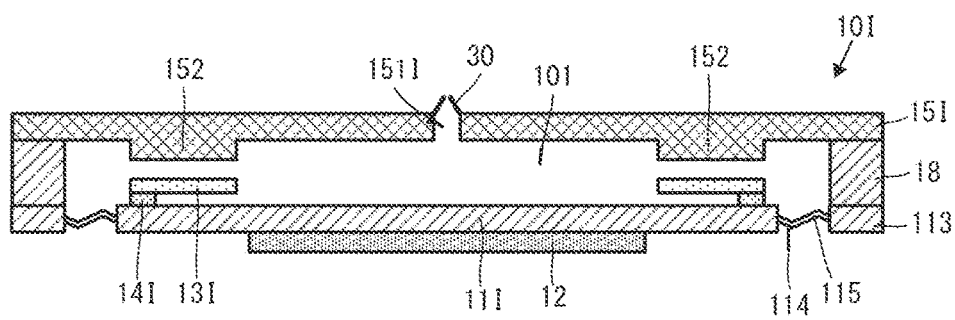
FIG. 20 is a cross-sectional view illustrating a configuration of a pump 10I according to a 10th embodiment of the present disclosure.

Next, a pump according to a 10th embodiment of the present disclosure will be described with reference to the drawing. FIG. 20 is a cross-sectional view illustrating a configuration of a pump 10I according to the 10th embodiment of the present disclosure. Note that, in FIG. 20, only the minimum necessary configuration is described as the pump, and the descriptions of the other parts are omitted.

As illustrated in FIG. 20, the pump 10I according to the tenth embodiment is different from the pump 10H according to the ninth embodiment in configurations of a hole 151I and a check valve 30. Note that a vibrating plate 11I is similar to the vibrating plate 11H, a film valve 13I is similar to the film valve 13H, and a joint member 14I is similar to the joint member 14H. In addition, a flow path forming member 15I is similar to the flow path forming member 15H except that the flow path forming member 15I has the hole 151I and does not have the holes 151H.

The pump 10I includes the flow path forming member 15I. The flow path forming member 15I has the hole 151I. The hole 151I penetrates through the flow path forming member 15I in a thickness direction. The hole 151I is disposed at the center of the flow path forming member 15I.

The check valve 30 is disposed in the hole 151I, permits a flow of the fluid from the pump chamber 101 to the outside, and blocks a flow of the fluid from the outside to the pump chamber 101.

Even with such a configuration, the pump 10I can obtain similar operation and effects to the pump 10H.

Figure 21:
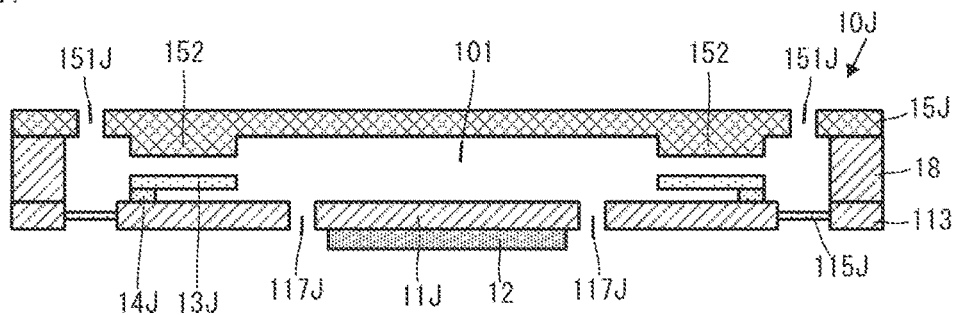
FIG. 21 is a cross-sectional view illustrating a configuration of a pump 10J according to an 11th embodiment of the present disclosure.

Next, a pump according to an 11th embodiment of the present disclosure will be described with reference to the drawing. FIG. 21 is a cross-sectional view illustrating a configuration of a pump 10J according to the 11th embodiment of the present disclosure. Note that, in FIG. 21, only the minimum necessary configuration is described as a pump, and the descriptions of the other parts are omitted.

As illustrated in FIG. 21, the pump 10J according to the eleventh embodiment is different from the pump 10H according to the ninth embodiment in positions where holes 151J are formed in a flow path forming member 15J, a support member 115J, and holes 117J. Note that a film valve 13J is similar to the film valve 13H, and a joint member 14J is similar to the joint member 14H. The flow path forming member 15J is similar to the flow path forming member 15H except that the flow path forming member 15J has the holes 151J and does not have the holes 151H.

The vibrating plate 11J includes the plurality of holes 117J. The plurality of holes 117J penetrate through the vibrating plate 11J in a thickness direction. The plurality of holes 117J are disposed so as to be spaced apart from one another in a circumferential direction. Preferably, the plurality of holes 117J overlap a node of a vibration of the vibrating plate 11J. The plurality of holes 117J correspond to the "third vent hole" of the present disclosure.

The support member 115J is formed of a resin film containing polyimide, liquid crystal polymer, PET, or the like as a main material, has elasticity, and has no gap.

By using such a material, the support member 115J has a low elastic modulus, and thus is more flexible than the vibrating plate 11J. Therefore, since the support member 115J has a weak force to restrain the vibrating plate 11J, the vibrating plate 11J can vibrate with large displacement.

The flow path forming member 15J has a plurality of holes 151J. The plurality of holes 151J are disposed so as to be spaced apart from one another in the circumferential direction. The plurality of holes 151J are disposed on an outer edge side relative to the protruding portion 152. The plurality of holes 151J correspond to the "fourth vent hole" of the present disclosure.

Even with such a configuration, the pump 10J can obtain similar operation and effects to the pump 10H.

Note that, in the 11th embodiment, even when the support member 115J is made of the same material as the vibrating plate 11J, when the thickness of the support member 115J is thinner than the thickness of the vibrating plate 11J, the flexibility of the support member becomes higher than the flexibility of the vibrating plate 11J, and therefore, similar operation and effects can be obtained.

In the ninth to eleventh embodiments, the fifth film valves 13H, 13I, and 13J are configured to suppress the discharge of the fluid from the central space to the outer edge space of the pump chamber and suck the fluid from the outer edge space to the central space. However, conversely, it may be configured such that the suction of the fluid from the outer edge space to the central space of the pump chamber is suppressed, and the fluid is discharged from the central space to the outer edge space. In this case, the film valve is in contact with or separates by the fluid passing through the inside and the outside of a film valve to open and close a flow path.

Figure 22:
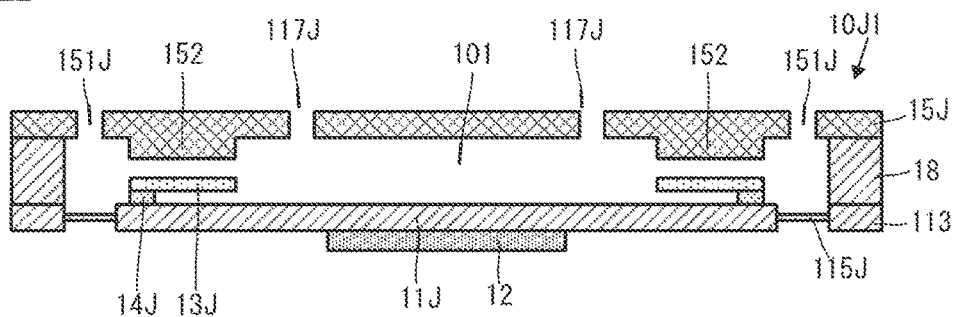
FIG. 22 is a cross-sectional view illustrating a configuration of a pump 10J1 according to a first modification of the eleventh embodiment of the present disclosure.

Next, a pump 10J1 according to a first modification of the eleventh embodiment of the present disclosure will be described with reference to the drawing. FIG. 22 is a cross-sectional view illustrating a configuration of the pump 10J1 according to the first modification of the eleventh embodiment of the present disclosure. Note that, in FIG. 22, only the minimum necessary configuration is described as a pump, and the descriptions of the other parts are omitted.

As illustrated in FIG. 22, the holes 117J are formed in the flow path forming member 15J. Preferably, the plurality of holes 117J overlap the node of a vibration of the vibrating plate 11J. However, the holes 117J may be formed in the vicinity of the center of the flow path forming member 15J.

Further, the plurality of holes 117J are formed in the flow path forming member 15J, but only the one hole 117J may be formed.

In the configuration of FIG. 22, the holes 117J and 151J are formed on the same surface. That is, a complicated mechanism is required to shield the pump 10J1. However, by providing the configuration illustrated in FIG. 22, similar effects to the pump 10J illustrated in FIG. 21 are obtained.

Figure 23:
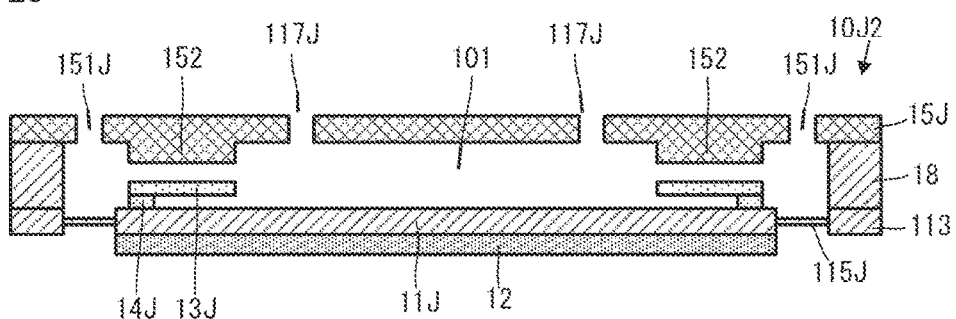
FIG. 23 is a cross-sectional view illustrating a configuration of a pump 10J2 according to a second modification of the eleventh embodiment of the present disclosure.
Figure 24:
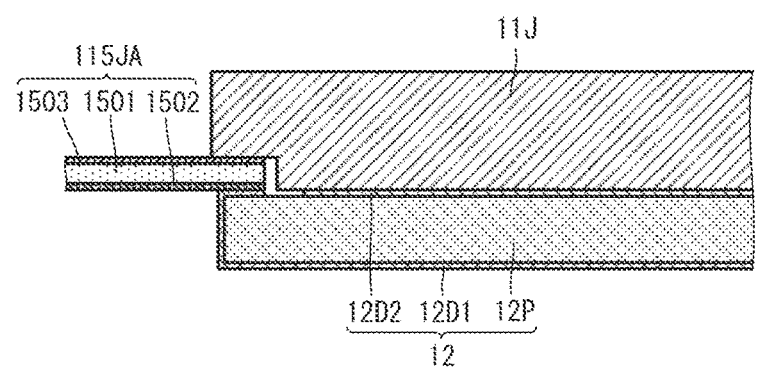
FIG. 24 is an enlarged cross-sectional view illustrating a joint portion of a support member, a piezoelectric element, and a vibrating plate according to the second modification of the eleventh embodiment of the present disclosure.

Next, a pump 10J2 according to a second modification of the eleventh embodiment of the present disclosure will be described with reference to the drawings. FIG. 23 is a cross-sectional view illustrating a configuration of the pump 10J2 according to the second modification of the eleventh embodiment of the present disclosure. FIG. 24 is an enlarged cross-sectional view illustrating a joint portion of the support member, the piezoelectric element, and the vibrating plate according to the second modification of the eleventh embodiment of the present disclosure. Note that, in FIG. 23, only the minimum necessary configuration is described as a pump, and the descriptions of the other parts are omitted.

As illustrated in FIG. 23, the holes 117J may be formed in the flow path forming member 15J, and the support member 115J may be a configuration which has a conductive path to the piezoelectric element 12. Even with this configuration, similar operation and effects to the operation and effects in FIG. 21 are obtained.

FIG. 24 is the enlarged cross-sectional view for disclosing the joint portion of the support member, the piezoelectric element, and the vibrating plate in the configuration in FIG. 23.

A support member 115JA is formed of a substrate 1501 having an insulating property, a conductor pattern 1502, and a conductor pattern 1503. The conductor pattern 1502 is formed on one principal surface of the substrate 1501, and the conductor pattern 1503 is formed on another principal surface of the substrate 1501. Note that the conductor pattern 1502 and the conductor pattern 1503 may have any shape as long as both the conductor patterns are insulated from each other. For example, a structure may be such that the entire surface of the substrate 1501 is covered or a part of the substrate 1501 is exposed.

The piezoelectric element 12 is formed of a piezoelectric body 12P, a driving electrode 12D1, and a driving electrode 12D2. The driving electrode 12D1 is mainly formed on one principal surface of the piezoelectric body 12P, and a part thereof extends to another principal surface through a side surface of the piezoelectric body 12P. The driving electrode 12D2 is formed on another principal surface of the piezoelectric body 12P, and is spaced apart from the driving electrode 12D1.

The conductor pattern 1502 is in contact with and connected to the driving electrode 12D1 formed on another principal surface of the piezoelectric body 12P. The conductor pattern 1503 is in contact with the conductive vibrating plate 11J and is connected to the driving electrode 12D2 of the piezoelectric element 12 via the vibrating plate 11J.

Figure 25:
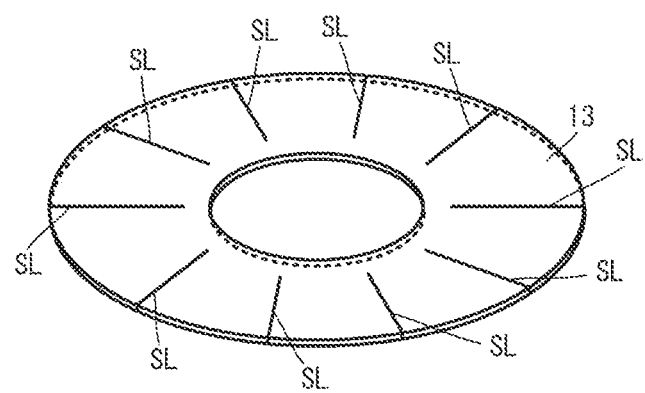
FIG. 25 is a perspective view illustrating an example of a derivative of the film valve 13.

Note that, in each of the above-described embodiments, the aspect in which one flat film-shaped film valve is used is described, but the film valve may have a configuration as illustrated in FIG. 25.

FIG. 25 is a perspective view illustrating an example of a derivative of the film valve. As illustrated in FIG. 25, the film valve 13 has an annular shape and has a plurality of slits SL. Each of the plurality of slits SL has a shape extending in a radiation direction of the film valve 13. Each of the plurality of slits SL reaches the outer end of the film valve 13, but does not reach the inner end of the film valve 13. Even such a configuration can be applied to the pump having the aspect in which the inner end side described above is fixed.

Note that, although not illustrated, the pump having the aspect in which the outer end side is fixed may have a shape such that the plurality of slits SL reach the inner end of the film valve 13 and does not reach the outer end of the film valve 13.

Further, the film valve 13 may have an aspect in which a plurality of fan-shaped films partially overlap one another and are disposed over the entire circumference.

(Variation)

Figure 26:
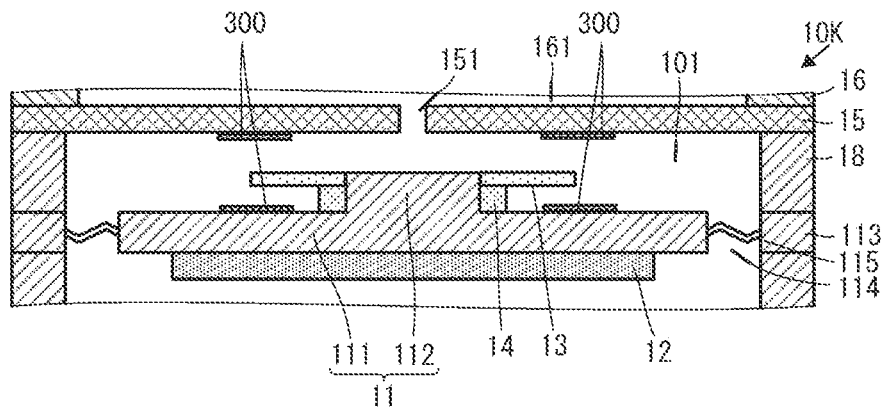
FIG. 26 is a cross-sectional view illustrating a configuration of a pump 10K according to a modification of the present disclosure.

FIG. 26 is a cross-sectional view illustrating a configuration of a pump 10K according to a modification of the first embodiment of the present disclosure. The pump 10K is different from the pump 10 according to the first embodiment in that coating agents 300 are applied. Other configuration of the pump 10K is similar to the configuration of the pump 10, and the descriptions of similar portions will be omitted.

As illustrated in FIG. 26, the coating agents 300 are applied to a portion facing a movable range of the film valve 13. More specifically, the coating agents 300 are applied to one principal surface of the flow path forming member 15 and one principal surface of the thin portion 111 of the vibrating plate 11 so as to face the movable range of the film valve 13.

With this configuration, the damage caused by the film valve 13 coming into contact with the flow path forming member 15 or the thin portion 111 of the vibrating plate 11 can be suppressed.

Note that a main component of the coating agent 300 may be a resin having a Young's modulus value lower than Young's modulus values of the flow path forming member 15 and the thin portion 111 of the vibrating plate 11, such as silicone rubber, PTFE or the like. Since these coating agents have low Young's modulus values, the impact when the film valve is in contact with the flow path forming member 15 or the thin portion 111 of the vibrating plate 11 can be mitigated, thereby suppressing the damage to the film valve 13.

Note that it is more preferable that the coating agent 300 contain fluorine or molybdenum disulfide as a main component. Since the surfaces of these coating agents have lubricity, the damage due to the friction of the film valve 13 with the flow path forming member 15 or the thin portion 111 of the vibrating plate 11 can be suppressed.

Similar effects are also obtained when the coating agent 300 is applied to one of the flow path forming member 15 and the thin portion 111 of the vibrating plate 11.

It should be noted that the configurations of the respective embodiments described above can be combined as appropriate, and the operation and effects corresponding to the respective combinations can be obtained.

10, 10A, 10B, 10C, 10D, 10E, 10F, 10G, 10H, 10I, 10J, 10K PUMP
11, 11A, 11D, 11G, 11H, 11I, 11J PLATE-SHAPED MEMBER
12, 12D PIEZOELECTRIC ELEMENT
12P PIEZOELECTRIC BODY
13, 13A, 13B, 13C, 13G, 13H, 13I, 13J FILM VALVE
14, 14A, 14C, 14G, 14H, 14I, 14J JOINT MEMBER
15, 15H, 15I, 15J, 16 FLOW PATH FORMING MEMBER
17 COVER MEMBER
18 SIDE WALL MEMBER
20 VALVE
21 FIRST CASE MEMBER
22 SECOND CASE MEMBER
23 DIAPHRAGM
24 JOINT FILM
25 REINFORCING FILM
26 ADHESIVE MEMBER
27 COUPLING MEMBER
101 PUMP CHAMBER
111, 111D THIN PORTION
112 THICK PORTION
113 SUPPORT PLATE
114 GAP
115, 115J SUPPORT MEMBER
117J HOLE
131, 131C FILM VALVE
141, 141C JOINT MEMBER
151, 151H, 151I, 151J HOLE
161 OPENING
171 HOLE
201 SUCTION PORT
202 DISCHARGE PORT
203 EXHAUST PORT
300 COATING AGENT
1151 FIRST BEAM PORTION
1152 SECOND BEAM PORTION
1153 THIRD BEAM PORTION
1501 SUBSTRATE
1502, 1503 CONDUCTOR PATTERN
SL SLIT

The invention claimed is:

1. A pump comprising:
a plate-shaped member including:
a vibrating plate having a piezoelectric element disposed on one principal surface,
a support plate, and
a plurality of support members connecting the vibrating plate and the support plate and supporting the vibrating plate so that the vibrating plate is configured to vibrate in a principal surface direction, and including:
a first vent hole between the plurality of support members;
a flow path forming member disposed so as to face the plate-shaped member and having a second vent hole in a portion facing the plate-shaped member;
a pump chamber provided so as to be surrounded by the plate-shaped member, the flow path forming member, and a side wall member connected to the plate-shaped member and the flow path forming member, and having a central space communicating with the second vent hole and an outer edge space communicating with the first vent hole; and
a first film valve disposed in the pump chamber,
wherein the first film valve is disposed in a position where the second vent hole is located in an area surrounded by an outer end of the first film valve in a plan view, and a central portion of the first film valve is deformably fixed to a thicker portion of the vibrating plate and an outer end portion of the first film valve is not joined to the vibrating plate.

2. The pump according to claim 1, wherein the central portion of the first film valve is an inner end side thereof.

* * * * *